(12) United States Patent
Shimamoto

(10) Patent No.: US 7,855,607 B2
(45) Date of Patent: Dec. 21, 2010

(54) RING OSCILLATION CIRCUIT, DELAY TIME MEASURING CIRCUIT, TESTING CIRCUIT, CLOCK GENERATING CIRCUIT, IMAGE SENSOR, PULSE GENERATING CIRCUIT, SEMICONDUCTOR INTEGRATED CIRCUIT, AND TESTING METHOD THEREOF

(75) Inventor: Yukihiro Shimamoto, Ikoma (JP)

(73) Assignee: Sharp Kabushiki Kaisha, Osaka (JP)

(*) Notice: Subject to any disclaimer, the term of this patent is extended or adjusted under 35 U.S.C. 154(b) by 110 days.

(21) Appl. No.: 12/223,532

(22) PCT Filed: Nov. 30, 2006

(86) PCT No.: PCT/JP2006/323941

§ 371 (c)(1),
(2), (4) Date: Aug. 1, 2008

(87) PCT Pub. No.: WO2007/088672

PCT Pub. Date: Aug. 9, 2007

(65) Prior Publication Data

US 2009/0051396 A1    Feb. 26, 2009

(30) Foreign Application Priority Data

Feb. 2, 2006  (JP) .............................. 2006-025188
Aug. 11, 2006 (JP) .............................. 2006-220184

(51) Int. Cl.
*H03K 3/03* (2006.01)
*G01R 23/175* (2006.01)

(52) U.S. Cl. .................... 331/57; 331/44; 324/76.54; 702/79

(58) Field of Classification Search ............... 331/44, 331/57; 324/76.52, 76.54, 76.77; 368/118; 702/79
See application file for complete search history.

(56) References Cited

U.S. PATENT DOCUMENTS

| | | | |
|---|---|---|---|
| 4,504,749 A * | 3/1985 | Yoshida | 327/276 |
| 5,083,299 A * | 1/1992 | Schwanke et al. | 368/113 |
| 5,351,211 A | 9/1994 | Higeta et al. | |
| 6,611,477 B1 * | 8/2003 | Speyer et al. | 368/113 |

(Continued)

FOREIGN PATENT DOCUMENTS

JP     62-147371     7/1987

(Continued)

Primary Examiner—Robert Pascal
Assistant Examiner—Levi Gannon
(74) Attorney, Agent, or Firm—Harness, Dickey & Pierce, P.L.C.

(57) ABSTRACT

A ring oscillation circuit, which can operate the ring oscillation due to a positive feedback stably and continuously, is provided and it is applied to an accurate measurement of delay time and a measurement of timing accuracy in a jitter of a clock signal or the like with a high accuracy. A ring oscillation circuit comprises a delay circuit and a monostable multivibrator. An output of the delay circuit is connected to an input of the monostable multivibrator, an output of the monostable multivibrator is connected to an input of the delay circuit, and the delay circuit and the monostable multivibrator configure a positive feedback loop. An oscillation starting circuit for starting oscillation upon receipt of an input of a trigger pulse for triggering oscillation is provided on the positive feedback loop, or in the inside of the delay circuit or the monostable multivibrator.

14 Claims, 42 Drawing Sheets

U.S. PATENT DOCUMENTS

| | | | |
|---|---|---|---|
| 6,774,734 B2 * | 8/2004 | Christensen et al. | 331/57 |
| 7,046,094 B2 * | 5/2006 | Belluomini et al. | 331/44 |
| 7,254,505 B2 * | 8/2007 | Owens et al. | 702/89 |
| 2006/0026476 A1 | 2/2006 | Nishida | |

FOREIGN PATENT DOCUMENTS

| | | |
|---|---|---|
| JP | 2000-266819 | 9/2000 |
| JP | 2001-094403 | 4/2001 |
| JP | 2002-198783 | 7/2002 |
| JP | 2003-121505 | 4/2003 |

* cited by examiner

RING OSCILLATION CIRCUIT, DELAY TIME MEASURING CIRCUIT, TESTING CIRCUIT, CLOCK GENERATING CIRCUIT, IMAGE SENSOR, PULSE GENERATING CIRCUIT, SEMICONDUCTOR INTEGRATED CIRCUIT, AND TESTING METHOD THEREOF

CROSS-REFERENCE TO RELATED APPLICATIONS

This application is a National Phase filing under 35 U.S.C. §371 of International Application No. PCT/JP2006/323941 filed on Nov. 30, 2006, and which claims priority to Japanese Patent Application No. 2006-025188 filed on Feb. 2, 2006 and Japanese Patent Application No. 2006-220184 filed on Aug. 11, 2006.

TECHNICAL FIELD

The present invention relates to a measuring circuit of a delay time and a measuring method, and particularly, the present invention relates to a testing circuit and a testing method for evaluating a timing accuracy of a clock signal, which is generated by a PLL circuit or the like. In addition, the present invention relates to a clock generating circuit such as a PLL circuit equipped with the testing circuit and an image sensor. Further, the present invention relates to a semiconductor integrated circuit, capable of carrying out a delay test according to a scan path method applying a measuring circuit of the delay time and a testing method thereof.

BACKGROUND ART

Background Art 1

In a field of a high-speed image processing or the like, a demand of transferring the data at a high speed by using a clock signal of a high accuracy having few jitters has been intensified. For example, a device for transmitting the image data at 400 Mbps has been required by a cellular phone. On the other hand, as a circuit for generating a clock signal for this high-speed data transmission, a PLL (Phase Locked Loop) circuit for generating a high-speed clock by multiplying a reference signal has been widely used. However, a jitter (a fluctuation of the clock signal) is generated in the clock signal to be generated in the PLL circuit, and thereby, a timing accuracy of the clock signal for the high-speed data communication depends on a timing accuracy of the PLL circuit.

Accordingly, in order to secure a timing accuracy in the high-speed data communication, it is needed that the timing accuracy of the PLL circuit to be used for the high-speed data communication is tested at a high accuracy, for example, of not more than 100 ps or 50 ps. It is popular that an external measuring device such as a high-performance analog LSI tester and a measurement tool or the like is used for measuring the timing accuracy of jitter or the like of the PLL circuit, however, in the external measuring device, the measurement accuracy is not sufficient for testing the timing accuracy at a high accuracy of not more than 100 ps or 50 ps. Therefore, in the following Patent Document 1, a testing circuit, capable of testing the jitter or the like of the PLL circuit at a high accuracy only by a configuration of a logic circuit, and a testing method are suggested.

Referring to FIG. 20 (equivalent to FIG. 8 of Patent Document 1), the testing circuit disclosed in Patent Document 1 has a circuit configuration, which is formed by incorporating a variable delay circuit (configured by a Base Delay and an Adjustable Delay), capable of variably controlling the delay time, within the testing circuit, and in the circuit configuration, the jitters immediately after output of a VCO can be measured by detecting the timing difference between the signal, which is obtained by delaying the output signal of the VCO (the voltage control oscillator) equipped with a PLL circuit by a cycle by means of the variable delay circuit and the signal of the VCO. In addition, in the circuit configuration, the timing difference between the signal, which is obtained by delaying the output signal of the VCO by a half cycle by means of the variable delay circuit and the signal of the VCO is detected to enable measurement of the jitters of the section from the rising of the output signal of the VCO to the falling thereof or the section from the falling of the output signal of the VCO to the rising thereof. Further, the duty ratio of the output of the VCO can be also calculated, on the basis of the value of the measuring result of the jitter, without having to change the circuit configuration.

In the above-described measurement of jitter, since the accurate measurement of the delay time of the variable delay circuit can be realized by using not a set value but an actual measurement value, at the final stage of measurement, a negative feedback circuit including a variable delay circuit and a selector is formed by switching the input into the variable delay circuit from the output signal of the VCO to the output of the variable delay circuit by means of a selector to perform the ring oscillation operation, and the oscillation frequency of the ring oscillation is measured by means of a frequency counter, and then, the actual measurement value of the variable delay circuit is developed from that oscillation frequency.

Background Art 2

As one of a testing method of an LSI (a large-scale integrated circuit), a delay test according to a scan path method has been known. At first, the summary of the scan path method is described.

In the LSI, which realizes the scan path method, a testing circuit for connecting a plurality of flip-flops in a shift register-like shape is inserted. Hereinafter, this connected flip-flop is called as "a scan chain". Testing a circuit to be tested according to the scan path method includes putting the scan chain into a shift mode, inputting a test pattern from an external terminal via the scan chain to set the data in the all flip-flops, operating a circuit to be tested in an actual operational mode, returning the scan chain into the shift mode, and reading the operational result of the circuit to be tested via the scan chain.

In recent years, a delay test art according to the scan path method has been studied and developed. In the delay test according to the scan path method, as in the normal scan path method, the test is conducted by three operations including 1) a test pattern is inputted from the external terminal via the scan chain, 2) the circuit to be tested is operated in the actual operational mode, and 3) the operational result of the circuit to be tested is read via the scan chain. However, only 2) the circuit to be tested is operated in the actual operational mode is different from the normal scan path method. The test according to the normal scan path method includes inputting the test pattern from the external terminal via the scan chain, setting the data in the all flip-flops, and operating the circuit to be tested by this data. On the contrary, according to the delay test, after setting the data in the all flip-flops, the test to be tested is operated once (the launch operation), and then, the test to be tested is operated once more on the basis of the data to be stored in the flip-flop as a result of this, a result of this is stored in the flip-flop (the capture operation). In the delay test according to the scan path method, by testing if propagation of a signal between this launch operation and this capture operation is correctly carried out or not, it is tested that the propagation of the signal is terminated within a predetermined time.

The delay test according to the scan path method is remarkably characterized in that input of a clock is only needed for allowing the circuit to be tested to realize the launch operation and the capture operation. This is because the all flip-flops of the circuit to be tested are operated based on the rising edge of the clock and the all flip-flops load the data based on the rising edge of the clock. Due to this characteristic, in the delay test, it is a requirement to accurately generate timing of a launch clock to excite the launch operation and a capture clock to excite the capture operation. In addition, the delay test according to the scan path method is characterized in that, if only the launch clock and the capture clock can be accurately generated, a desired delay test can be realized.

Here, in response to a speeding up of the LSI in recent years, the clock to be required for the delay test is also required to have a high speed and a high accuracy. However, upon generation of a clock waveform by the LSI tester, there is a performance barrier and there is a problem that to apply launch and capture clock of a high accuracy at a high speed from the LSI tester is becoming difficult.

For this problem, it is proposed that the LSI itself is allowed to have a circuit for generating launch and capture clock with reference to the clock of the incorporated PLL, for example (refer to the following Patent Document 2 or Patent Document 3).

Patent Document 1: Japanese Patent Application Laid-Open No. 2003-121505

Patent Document 2: Japanese Patent Application Laid-Open No. 2006-38743

Patent Document 3: Japanese Patent Application Laid-Open No. 2000-266819

Patent Document 4: Japanese Patent Application Laid-Open No. 2001-94403

Patent Document 5: Japanese Patent Application Laid-Open No. 6-43220

DISCLOSURE OF THE INVENTION

Problems to be Solved by the Invention

Problem for Background Art 1

In the above-described conventional arts, there is a step where the variable delay circuit is allowed to perform the ring oscillation in the final stage of measurement and an oscillation frequency thereof is measured so as to obtain a measurement result. Here, as being known from the description of "here, in order to carry out the oscillation operation without fail, a circuit incorporating a Base-Delay 6 and an Adjustable-Delay 7 is made into an inverter circuit having odd stages" in the paragraph "0042" of Patent Document 1, the ring oscillation operation due to a negative feedback is carried out.

Hereinafter, for a convenience of explanation, if a time required for a rising edge to pass through a variable delay circuit (a circuit incorporating a Base-Delay and an Adjustable-Delay) is Dre, and a time required for a falling edge to pass through a variable delay circuit is Dfe, an oscillation period Tnf of the ring oscillation operation due to a negative feedback is given by a sum of the above-described two delay times Dre and Dfe as shown by the following mathematical expression 1.

$$Tnf = Dre + Dfe \quad \text{Mathematical Expression 1}$$

On the other hand, one delay time (in a measuring circuit shown in FIG. 20, a time Dre required for the rising edge to pass through a variable delay circuit) of the variable delay circuit is only needed as a parameter for measurement of jitter of the above-described conventional art. Here, there is a description of "the delay amount due to the Base-Delay 6 and the Adjustable-Delay 7 becomes ½ of a ring oscillator period" in the paragraph "0046" of Patent Document 1. This means that one delay time Dre is developed from the following mathematical experience 2 assuming that the above-described two delay times Dre and Dfe are equal in a pseudo manner (Dre nearly equal to Dfe).

$$Dre \text{ nearly equal to } (Dre+Dfe)/2 = Tnf/2 \quad \text{Mathematical Expression 2}$$

With reference to FIG. 21 (equivalent to FIG. 7 of Patent Document 1), the explanation will be given as follows. In the real calculation of jitter, a period jitter J of a clock signal to be outputted from the PLL circuit is given by the following mathematical expression 3 (equivalent to a mathematical expression 2 in the paragraph "0046" of Patent Document 1). Here, in a mathematical expression 3, Dmax is a delay time of the variable delay circuit at a point C of FIG. 2, and Dmin is a delay time of the variable delay circuit at a point A of FIG. 21.

$$J = Dmax - Dmin \quad \text{Mathematical Expression 3}$$

Accordingly, a jitter J can be developed from the mathematical expression 3 by measuring two delay times Dmax and Dmin. Here, in order to measure two delay times Dmax and Dmin, the variable delay circuit is allowed to be ring-oscillated as a negative feedback circuit, and an oscillation frequency thereof is measured. Hereinafter, with reference to FIG. 22, the explanation will be specifically given.

1) A set value of the variable delay circuit is set at the state of the A point of FIG. 22, and the ring oscillation operation is started.

2) An oscillation period thereof is measured, and it is determined to be Tmin.

3) Dmin is obtained by calculation (Dmin=Tmin/2).

4) In the same way, the set value of the variable delay circuit is set at the state of a C point of FIG. 22, and the ring oscillation operation is started.

5) An oscillation period thereof is measured, and it is determined to be Tmax.

6) Dmax is obtained by calculation (Dmax=Tmax/2).

7) From the mathematical expression 3, the jitter J is obtained from Dmax and Dmin that are obtained in 3) and 6), respectively.

In the following procedures, conversion of the delay time of the variable delay circuit from the set value into the actual measurement value is carried out. However, in the case that there is a difference between two delay times Dre and Dfe (Dre≠Dfe), ½ of this difference (|Dre−Dfe|/2) gives an influence on the result of measurement of jitter as a measurement error. With reference to FIG. 23 and FIG. 24, this measurement error will be explained. FIG. 23 is a schematic view of a measuring circuit for developing a delay time of a variable delay circuit from an oscillation period in its ring oscillation operational state, and an inverter for forming a negative feedback loop is inserted between an input node N1 and an output node N2 of the variable delay circuit. FIG. 24 is a voltage waveform view showing an oscillation waveform in the input node N1 and the output node N2 of the variable delay circuit in the ring oscillation operational state. In FIG. 24, a propagation delay time Dre between the input and output nodes N1 and N2 with respect to a rising edge, a propagation delay time Dfe between the input and output nodes N1 and N2 with respect to a falling edge, an oscillation period Tnf in a ring oscillation operational state due to a negative feedback, a high level time period Twh of an oscillation pulse at the input node N1 of the variable delay circuit, and a low level time period Twl thereof are illustrated, respectively. A relation of the following mathematical expression 4 is established with respect to each of these times.

$Tnf = Twh + Twl = Dre + Dfe$  Mathematical Expression 4

Here, assuming that two delay times Dre and Dfe are equal in a pseudo manner (Dre nearly equal to Dfe) in the above-described conventional art, in the above-described mathematical expression 2, the rising edge propagation delay time Dre is developed in a pseudo manner. However, in this calculation, it is known that an error shown in the following mathematical expression 5 is generated in the case that there is a difference between the two delay times Dre and Dfe (Dre≠Dfe).

$(Dre+Dfe)/2 - Dre = (Dre-Dfe)/2$  Mathematical Expression 5

Here, returning to FIG. 22, when a rising edge propagation time at a C point of the variable delay circuit is defined as Dmaxr, a rising edge propagation time at an A point of the variable delay circuit is defined as Dminr, a falling edge propagation time at the C point of the variable delay circuit is defined as Dmaxf, a falling edge propagation time at the A point of the variable delay circuit is defined as Dminf, an oscillation period of the ring oscillation operation upon setting at the C point of the variable delay circuit is defined as Tmax (=Dmaxr+Dmaxf), an oscillation period of the ring oscillation operation upon setting at the A point of the variable delay circuit is defined as Tmin (=Dminr+Dminf), a jitter including an error to be measured by the conventional art is defined as J1, and an actual jitter to be originally measured is defined as J0, respectively, J1 and J0 are shown by mathematical expressions 6 and 7.

$J1 = (Tmax/2) - (Tmin/2) = (Dmaxr+Dmaxf)/2 - (Dminr+Dminf)/2$  Mathematical Expression 6

$J0 = Dmaxr - Dminr$  Mathematical Expression 7

Accordingly, an error Δ that is obtained from a difference between the both jitters is given by the following mathematical expression 8.

$$\begin{aligned}
\Delta &= J1 - J0 \\
&= (Dmaxr + Dmaxf)/2 - \\
&\quad (Dminr + Dminf)/2 - \\
&\quad (Dmaxr - Dminr) \\
&= (Dmaxf - Dmaxr)/2 - \\
&\quad (Dminf - Dminr)/2
\end{aligned}$$  Mathematical Expression 8

As a result, it has been known that an error is generated depending on a difference between the rising edge propagation time and the falling edge propagation time at the C point of the variable delay circuit, |Dmaxr−Dmaxf|, and a difference between the rising edge propagation time and the falling edge propagation time at the A point of the variable delay circuit, |Dminr−Dminf|.

These differences between the propagation times have the values in the range of several 10 ps to several 100 ps in the case of the variable delay circuit, which is normally designed. Therefore, if the variable delay circuit is designed with efforts so that no difference is generated depending on a difference of the set values of the delay times, this difference between the propagation times has no influence on measurement. However, a warranty scope of the jitter of the PLL circuit to be used for a recent communication device is becoming small as much as a warranty of several 10 ps is required. In other words, due to change of the circumstances of recent years, the error which can be ignored conventionally is becoming unignorable and a problem of the error is becoming serious.

The reason why the difference between the rising edge propagation time and the falling edge propagation time of the variable delay circuit becomes a problem is that the ring oscillation operation due to the negative feedback is carried out in order to obtain these delay times and the oscillation period is obtained from a sum of the rising edge propagation time and the falling edge propagation time.

Therefore, a reason why the ring oscillation operation due to the negative feedback is used and the ring oscillation operation due to the positive feedback is not used in the above-described conventional art will be described.

Since the ring oscillation operation due to the negative feedback is the oscillation operation at a negative feedback loop including the variable delay circuit, for example, a signal level of an input node of the variable delay circuit (at a high level or a low level, corresponding to a binary logic level) makes a circuit of the negative feedback loop and the signal level is reversed to return to the same input node. Therefore, the signal level of the input node is not stabilized to spontaneously start the oscillation operation. On the contrary, since the ring oscillation operation due to the positive feedback is the oscillation operation at a positive feedback loop including the variable delay circuit, for example, a signal level of an input node of the variable delay circuit makes a circuit of the positive feedback loop and the same signal level returns to the same input node. Therefore, the signal level of the input node is stabilized to any one of the high level or the low level. As a result, there is a first problem such that the oscillation operation is not started spontaneously in this stable state, and further, there is a second problem such that, even if the oscillation operation is started once, it attains to any stable state as described above immediately to stop the oscillation. Accordingly, for the ring oscillation operation, the negative feedback loop is normally used.

Next, with respect to the above-described two problems in the ring oscillation operation due to the positive feedback, the explanation will be given with reference to FIG. 25 and FIG. 26. FIG. 25 is a schematic view of a measuring circuit for developing a delay time of a variable delay circuit from an oscillation period in its ring oscillation operational state, and the output node N2 is directly connected to the input node N1 of the variable delay circuit in order to form a positive feedback loop. FIG. 26 is a voltage waveform view showing an oscillation waveform in the input node N1 and the output node N2 of the variable delay circuit in the ring oscillation operational state due to the positive feedback.

In other words, the signal level of the input node N1 and the signal level of the output node N2 of the variable delay circuit in FIG. 25 coincide with each other because they are positively returned. If the signal level of the input node N1 (the output node N2) stops without oscillation, this stopping state is continued stably, so that the oscillation is not started spontaneously from this stable state.

Here, the case that, for example, a pulse signal of a shorter pulse width than a delay time of the variable delay circuit is compulsorily inputted in the input node N1 by adding any external disturbance is supposed. This inputted pulse signal is propagated to the output node N2 to be positively returned to the input node N1 and further, is propagated to the output node N2 so as to start the oscillation operation due to the positive feedback once. Here, when the propagation delay time Dre between the input and output nodes N1 and N2 with respect to a rising edge of the variable delay circuit is not equal to the propagation delay time Dfe between the input and output nodes N1 and N2 with respect to a falling edge of the variable delay circuit (Dre≠Dfe), the pulse width of the pulse signal, which is originally inputted, becomes shorter or longer by a difference between the two delay times Dre and Dfe|Dre−Dfe| every time the pulse signal makes the circuit of the positive feedback loop, and finally, the pulse width becomes 0 or becomes longer than the delay time of the variable delay circuit. Then, the pulse is vanished to stop the ring oscillation operation. As a result, in order for the ring oscillation due to the positive feedback to be stably continued, it is necessary to make two delay times with respect to the rising edge and the falling edge accurately equal, and by the positive feedback loop formed by only a delay circuit, the ring oscillation operation is not possible in a practice sense even if it is possible in theory.

Problem for Background Art 2

According to the above-described conventional art disclosed in Patent Document 2, a clock of the PLL circuit to be incorporated in an LSI is used for generation of launch and capture clock. Specifically, a circuit, which takes out only two clocks from clocks at a high speed of the PLL circuit by means of a clock generating circuit to supply each of them as a launch clock and a capture clock, respectively, has been suggested. However, since the PLL circuit is used for generation of the launch and capture clock, the following three problems may be considered.

1) At first, there is a problem such that a test cannot be started unless a user waits until the PLL circuit is locked. The fact that the output of the PLL is stabilized at a predetermined frequency is called as "a PLL circuit is locked". Normally, in the PLL circuit, there is a state that the PLL circuit has not been locked for about several 100 ps to several ms from the start of the operation. This is a waiting time, which cannot be avoided in an operational principle of the PLL circuit. Also in the case of using this for a delay test, the start of a delay test should wait for start of the delay test until the PLL circuit is locked.

2) Secondly, there is a problem such that, in order to maintain the locked state of the PLL circuit, the clock cannot be stopped until the all delay tests are completed. The PLL circuit may carry out the operation for generating the clocks being the integral multiple of the reference clocks. Therefore, in order to maintain the PLL circuit in a locked state, it is necessary to continue input of the reference clock. The same applies to the case of using the PLL circuit for the delay test, and it is necessary to continue input of the reference clock from the start of the test until the end thereof. However, when a plurality of test patterns is performed, for example, a timing that the reference clock cannot be applied between the patterns occurs. As a result, the PLL circuit cannot maintain the locked state and due to the above-described first problem, a waiting time is required until the locked state is obtained again.

3) Thirdly, since a timing of launch and capture clock is generated on the basis of the clock edge of the clock of the PLL circuit, there is a problem such that the timing between the launch clock and the capture clock can be only set at a value, which is the integral multiple of the output clock period of the PLL circuit. When a delay test is conducted from the launch and capture clock, which are generated on the basis of the clock of the PLL circuit, only the edge of the clock to be outputted from the PLL circuit decides timing. Therefore, the timing between the launch clock and the capture clock can be only set at a value, which is the integral multiple of the output clock period of the PLL circuit. When the delay test is conducted under three timing conditions, for example, 3 ns, 3.5 ns, and 4 ns, it is necessary for the PLL circuit to be able to generate a clock at 2 GHz. In addition, it is also necessary for a pulse generating circuit for a delay test itself to ensure the operation at 2 GHz although locally.

Therefore, in order to avoid a problem of the conventional art, which is disclosed in Patent Document 2, it is considered that a capture clock is generated without using the clock of the PLL circuit but using a variable delay circuit, for example, as disclosed in Patent Document 3. In this circuit, since the clock of the PLL circuit is not used, three problems, which become problematic, are not generated, however, the following fourth and fifth problems are generated.

4) Fourthly, there is a problem such that the delay time of the variable delay circuit cannot be obtained. In the paragraph "0041" of the description of Patent Document 3, it is described that "the operational time of a synchronizing circuit 1 can be obtained using the delay time per stage of a buffer as a unit". This description means that "when the delay time per stage of the buffer has not been known, this time is not known" as it is.

5) Fifthly, there is a problem such that a time difference between the launch clock and the capture clock cannot be controlled so that the time difference is set to be not more than a pulse width to be inputted from the outside. The delay time cannot be controlled so that the delay time is set to be not more than the pulse width to be inputted from the outside because the capture clock is generated by delaying the launch clock itself by means of the variable delay circuit. If the delay time is set to be not more than the pulse width to be inputted from the outside, this leads to that the capture clock rises before falling of the launch clock, and thereby, the circuit is not operated correctly not to enable conducting of the delay test.

Here, if the delay time of the variable delay circuit is known, the operational time of the circuit is known. A method of obtaining a delay time of a variable delay circuit, or a method of adjusting the delay time of the variable delay circuit into a predetermined delay time is suggested in the above-described Patent Document 4.

According to the conventional art disclosed in the above-described Patent Document 4, as a ring oscillator, a negative feedback circuit is used. In this case, the following sixth problem will be generated.

6) In the case that the propagation time of the rising edge and the propagation time of the falling edge of the variable delay circuit are different, the difference among these propagation times becomes a measurement error.

The measurement error generated in this sixth problem is the same as the error indicated by the mathematical expression 5 in the above-described Problem for Background Art 1, and the explanation overlapping between them is herein omitted.

Here, the difference between the rising edge propagation delay time Dre and the falling edge propagation delay time Dfe, namely, (Dre−Dfe) shown in the mathematical expression 5 has a value in the range of several 10 ps to several 100 ps in the case of the variable delay circuit, which is normally designed. Therefore, if the variable delay circuit is designed with efforts so that no difference is generated between the propagation delay times, the difference has no influence on measurement. However, in recent years, the operational frequency of the LSI tends to be increased in speed, for example, in the range of 100 MHz to several GHz, and an accuracy of the clock edge required by the delay test for such a circuit, which is increased in speed, is becoming small as much as a warranty of several 10 ps is required. In other words, change of the circumstances of recent years such that this error is becoming unignorable makes the sixth problem more serious.

In addition, in connection with the above-described fourth problem, according to the conventional art disclosed in the Patent Document 5, a method of adjusting the delay time of the variable delay circuit, basically, by making one variable delay circuit into a ring oscillation state and measuring its frequency is utilized. This causes a seventh problem in addition to the sixth problem.

7) In the case that the user wants to set a delay time shorter, it is necessary to prepare a circuit, which can count a clock of a frequency equivalent to this delay time. For example, in the case of setting a delay time of 500 ps, it is necessary to prepare a counting circuit, which operates at 1 GHz.

In the paragraph "0021" of the description of Patent Document 5, there is a description of "on the other hand, with respect to an output signal of a variable delay circuit VD, a selecting circuit S2 is switched by a selecting signal DMC, and then the signal reversed by an inverter INV is returned to the input side of the variable delay circuit VD so as to configure an oscillation circuit such as a ring oscillator (omit the rest)". In other words, it is known that a negative feedback circuit is utilized for a ring oscillator in the same way as the conventional art disclosed in the above-described Patent Document 4. Also in this case, the oscillation period Tnf of the ring oscillator is represented by a sum of the rising edge propagation delay time Dre and the falling edge propagation delay time Dfe, (Dre+Dfe) as shown in the mathematical expression 4. Therefore, when it is assumed that each propagation delay time is 500 ps, the oscillation period Tnf becomes 1 ns. In other words, this results in that the ring oscillator is oscillated at 1 GHz. Accordingly, it is necessary for a circuit in the range that the clock signal outputted from this ring oscillator is propagated to be designed so as to ensure the operation at 1 GHz. If measurement at a high speed and a high accuracy is required of the LSI, a specification, which is required by the inner circuit, is improved.

The present invention has been made taking the problem caused by the ring oscillation operation due to the negative feedback and the problem in the delay test according to the conventional scan path method into consideration and the first object of which is to provide a ring oscillation circuit, which can operate the ring oscillation due to a positive feedback stably and continuously, the second object of which is to provide a delay time measuring circuit, which can accurately measure a delay time with respect to a rising edge or a falling edge by applying the ring oscillation operation due to a positive feedback, the third object of which is to provide a testing circuit, which can evaluate a timing accuracy such as a jitter or the like of a clock signal, which is generated by a PLL circuit or the like, with a high accuracy, and a clock generating circuit including this testing circuit, and the fourth object of which is to provide a pulse generating circuit, which can immediately start a delay test according to a scan path method and carry out the delay test at a high speed and with a high accuracy, and a semiconductor integrated circuit.

Means for Solving the Problem

In order to accomplish the above-described first object, a ring oscillation circuit according to the present invention is characterized as the first characteristic by comprising a delay circuit and a monostable multivibrator, wherein the output of the delay circuit is connected to the input of the monostable multivibrator, the output of the monostable multivibrator is connected to the input of the delay circuit, and the delay circuit and the monostable multivibrator configure a positive feedback loop.

Further, the ring oscillation circuit of the above-described first characteristic is characterized as the second characteristic by comprising an oscillation starting circuit for starting oscillation upon receipt of an input of a trigger signal for triggering oscillation on the positive feedback loop.

Further, the ring oscillation circuit of the above-described first or second characteristic has the third characteristic in that a pulse width of a pulse signal to be outputted by the monostable multivibrator is shorter than one period of the ring oscillation operation in the positive feedback loop. Further, in the case that the pulse width of the pulse signal to be outputted by the monostable multivibrator is decreased due to a propagation time difference between a rising edge propagation time and a falling edge propagation time of the delay circuit, it is characterized in that the pulse width is longer than the propagation time difference. On the contrary, in the case that this pulse width is increased, it is characterized in that a sum of the pulse width and the propagation time difference is shorter than one period of the ring oscillation operation in the positive feedback loop.

According to the ring oscillation circuit having the above-described characteristic, if the ring oscillation circuit is started once, the monostable multivibrator outputs a pulse signal of a predetermined pulse width, and then, the pulse signal is supplied to the input of the delay circuit, and further, is supplied to the monostable multivibrator via the delay circuit. Therefore, even if there is a difference between the delay time of the rising edge and the delay time of the falling edge of the delay circuit, a pulse width of an oscillation pulse is regulated constantly by the monostable multivibrator every time the pulse signal makes the circuit of the positive feedback loop, and thereby, it is possible to stably continue the ring oscillation operation due to the positive feedback at a predetermined pulse width. Particularly, according to the ring oscillation circuit of the second characteristic, it becomes easy to start the ring oscillation operation.

In addition, in the ring oscillation operation due to the negative feedback, since the oscillation period becomes a sum of respective delay times of the rising edge and the falling edge to make the circuit of the negative feedback loop, it is not possible to accurately and individually measure the delay time for the rising edge and the falling edge to make the circuit of the feedback loop only by measurement of the oscillation period, and an error equivalent to ½ of these two delay time difference is generated. However, according to the ring oscillation operation due to the positive feedback, the oscillation period becomes a sum of any one delay time among the delay time with respect to the rising edge or the delay time with respect to the falling edge to make the circuit of the positive feedback and the delay time (the response time) of the monostable multivibrator, and thereby, if the delay time of the monostable multivibrator is known, it is possible to accurately develop the delay time of the delay circuit from the oscillation period.

Here, a positive feedback means the case that, in an arbitrary node on a feedback loop, a signal level of this node makes the circuit of the feedback loop to return at the same phase (the same logical level). Accordingly, the input and the output of the delay circuit are not necessarily needed to be the same phase, and when the input and the output of the delay circuit are the different phases (the logical levels are reversed), the monostable multivibrator may output a pulse of the opposite phase.

In order to accomplish the above-described second object, a delay time measuring circuit according to the present invention is a delay time measuring circuit for measuring a delay time of a circuit to be measured, and the delay time measuring circuit is characterized by: comprising a monostable multivibrator and an oscillation frequency measuring circuit, wherein the input of the monostable multivibrator can be connected to the output of the circuit to be measured, the output of the monostable multivibrator can be connected to the input of the circuit to be measured, the input and the output of the monostable multivibrator are connected to the output and the input of the circuit to be measured, respectively, and thereby, the circuit to be measured and the monostable multivibrator configure a positive feedback loop, and when measuring an oscillation frequency of the ring oscillation operation due to the positive feedback loop, the oscillation frequency measuring circuit can be connected to the positive feedback loop.

In order to accomplish the above-described second object, a delay time measuring method according to the present invention is a delay time measuring method for measuring a delay time of a circuit to be measured using the delay time measuring circuit having the above-described characteristic, and the delay time measuring method is characterized as the first characteristic by comprising: starting the ring oscillation operation due to the positive feedback by connecting the input of the monostable multivibrator to the output of the circuit to be measured, and connecting the output of the monostable multivibrator to the input of the circuit to be measured; measuring an oscillation frequency of the ring oscillation operation due to the positive feedback using the oscillation frequency measuring circuit; and measuring the delay time of the circuit to be measured on the basis of the measurement result of the oscillation frequency measuring circuit.

Further, the delay time measuring method according to the first characteristic is characterized as the second characteristic by comprising: using a monostable multivibrator for outputting a rising pulse signal of a predetermined pulse width with respect to a rising edge or a falling edge of an input signal when a rising edge propagation time is measured as the delay time of the circuit to be measured; and using a monostable multivibrator for outputting a falling pulse signal of a predetermined pulse width with respect to a falling edge or a rising edge of an input signal when a falling edge propagation time is measured as the delay time of the circuit to be measured.

According to the delay time measuring circuit or the delay time measuring method of the above-described characteristic, since an oscillation period defined by an inverse number of the oscillation frequency of the ring oscillation operation due to the positive feedback loop configured by the circuit to be measured and the monostable multivibrator is represented by a sum of the delay time of the circuit to be measured and the delay time of the monostable multivibrator. Therefore, if the delay time of the monostable multivibrator is known, it is possible to obtain the delay time of the circuit to be measured directly from the measured oscillation period. As a result, even if there is a difference between the rising edge propagation time and the falling edge propagation time of the circuit to be measured, it is possible to measure each of the delay times individually with a high accuracy.

In order to accomplish the above-described third object, a testing circuit according to the present invention is a testing circuit for evaluating a timing accuracy of a clock signal, and the testing circuit is characterized as the first characteristic by comprising: a variable delay circuit, capable of controlling a delay time; a phase comparing circuit for comparing a phase of the clock signal of a testing object with a phase of a delay clock signal obtained by delaying the clock signal using the variable delay circuit; a number counter for counting the number of outputs with respect to a predetermined comparison result from the phase comparing circuit; a monostable multivibrator; a signal switching circuit for switching a signal to be inputted into the variable delay circuit from the clock signal to a delay signal to be positively returned via the variable delay circuit and the monostable multivibrator to form a ring oscillator due to a positive feedback; and a frequency measuring circuit for measuring an oscillation frequency when the ring oscillator is formed by the signal switching circuit.

Further, the testing circuit according to the above-described first characteristic has the second characteristic in that the testing circuit and a clock generating circuit for generating the clock signal of the testing object are formed on a common substrate.

In order to accomplish the above-described third object, a testing method according to the present invention is a testing method for evaluating a timing accuracy of a clock signal using the testing circuit having the first or the second characteristic, and the testing method is characterized by comprising at the time of measuring of the delay time of the variable delay circuit: forming a ring oscillator due to a positive feedback by switching a signal to be inputted into the variable delay circuit from the clock signal to a delay signal to be positively returned via the variable delay circuit and the monostable multivibrator using the signal switching circuit; measuring an oscillation frequency of the ring oscillator by the oscillation frequency measuring circuit; and measuring the delay time of the variable delay circuit on the basis of the measurement result of the oscillation frequency measuring circuit.

According to the testing circuit or the testing method of the above-described characteristic, since an oscillation period defined by an inverse number of the oscillation frequency of the ring oscillation operation due to the positive feedback loop configured by the variable delay circuit and the monostable multivibrator is represented by a sum of the delay time of the variable delay circuit and the delay time of the monostable multivibrator. Therefore, in the case of evaluating a timing accuracy of a clock signal depending on a fluctuation range of the delay time of the variable delay circuit, since this timing accuracy can be measured directly as the fluctuation range of the oscillation period of the ring oscillation operation, measurement with a high accuracy becomes possible. In other words, even if there is a difference between the rising edge propagation time and the falling edge propagation time of the variable delay circuit, evaluation of the timing accuracy of the clock signal with a high accuracy becomes possible regardless of this difference. In this case, when the fluctuation range of the oscillation period is measured, the delay time of the monostable multivibrator is not varied, so that the delay time is cancelled. It is not necessary that the delay time of the monostable multivibrator is known, and as compared to the case of using the ring oscillation operation due to the negative feedback loop, evaluation of a timing accuracy of a clock signal with a higher accuracy becomes possible.

Further, in order to accomplish the third object, a clock generating circuit according to the present invention is a clock generating circuit for generating a clock signal by using a PLL circuit, and the clock generating circuit is characterized by comprising at least the variable delay circuit, the monostable multivibrator, and the signal switching circuit of the testing circuit according to the first or the second characteristic having the clock signal as the testing object.

According to the clock generating circuit of the above-described characteristic, since the clock generating circuit includes at least the variable delay circuit, the monostable multivibrator, and the signal switching circuit of the testing circuit according to the first or the second characteristic, the ring oscillation operation due to the positive feedback can be carried out, and the timing accuracy of the clock signal generated by the clock generating circuit can be evaluated with a high accuracy due to an effect of the testing circuit according to the first or the second characteristic.

Further, in order to accomplish the third object, an image sensor according to the present invention is characterized by comprising: a light sensor; memory means for memorizing the output data of the light sensor; transmitting means for transmitting the output data to be memorized by the memory means; and a clock generating circuit for generating a clock signal to control each operation of the light sensor, the memory means, and the transmitting means; wherein the clock generating circuit for generating a clock signal to control at least the operation of the transmitting means is the clock generating circuit according to the above-described character.

According to the image sensor according to the above-described character, since the clock generating circuit for generating a clock signal to control at least the operation of the transmitting means includes at least the variable delay circuit, the monostable multivibrator, and the signal switching circuit of the testing circuit according to the first or the second characteristic, the ring oscillation operation due to the positive feedback can be carried out, and the timing accuracy of the clock signal generated by the clock generating circuit can be evaluated with a high accuracy due to an effect of the testing circuit according to the first or the second characteristic. As a result, it is possible to evaluate a performance of the image sensor with a high accuracy.

Further, in order to accomplish the above-described fourth object, a pulse generating circuit according to the present invention is characterized as the first characteristic by comprising: a delay circuit unit for outputting at least two different delay signals with respect to an input clock signal and adjusting a delay time of a second delay signal from the input clock signal, the second delay signal being a later signal among the two different delay signals; a monostable multivibrator; a control circuit for controlling a signal connection in order to individually form a first positive feedback loop, in which an output signal of the monostable multivibrator returns to an input of the monostable multivibrator via a signal delay path from the input clock signal to the second delay signal within the delay circuit unit, and a second positive feedback loop, in which the output signal of the monostable multivibrator returns to the input of the monostable multivibrator without being routed through the signal delay path, and adjusting the delay time of the variable delay circuit; an oscillation frequency measuring circuit for measuring an oscillation frequency of any one of the formed positive feedback loops with any one of the first positive feedback loop and the second positive feedback loop being individually formed; and a pulse generating circuit for generating a pulse signal from the input clock signal and the two different delay signals, the pulse signal having at least two times of the rising edges or the falling edges within one period of the input clock signal and a time difference between the two times of the rising edge or the falling edge equal to the delay time of the second delay signal from the input clock signal.

Further, the pulse generating circuit according to the above-described first characteristic has the second characteristic in that the delay circuit unit is formed by cascade-connecting two delay circuits, at least one of the two delay circuits being a variable delay circuit capable of adjusting the delay time, and the two delay circuits individually output the two different delay signals.

Further, the pulse generating circuit according to the above-described first characteristic has the third characteristic in that the delay circuit unit is formed by arranging two delay circuits in parallel, at least one of the two delay circuits being a variable delay circuit capable of adjusting the delay time, and the two delay circuits receive the same input clock signal and individually output the two different delay signals.

Further, the pulse generating circuit according to the first or the second characteristic has the fourth characteristic in that one of the two delay circuits is a fixed delay circuit having a fixed delay time.

Further, the pulse generating circuit according to any one of the first to the fourth characteristics is characterized as the fifth characteristic by comprising a selecting circuit for alternatively selecting the pulse signal and the input clock signal in response to an input of an external control signal and outputting the selected signal.

Moreover, the pulse generating circuit according to the fifth characteristic is characterized as the sixth characteristic by comprising a second pulse generating circuit for generating a second pulse signal to be outputted in synchronization with a time period in which the selecting circuit is selecting the pulse signal, from a first delay signal and the external control signal, the first delay signal being a faster signal among the two different delay signals.

According to the pulse generating circuit of the above-described characteristic, two times of the rising edges or the falling edges of the pulse signal generated by the pulse generating circuit can be used as each clock edge of the launch operation and the capture operation to be used for the delay test according to the scan path method. In this case, the time difference between the launch clock edge and the capture clock edge is equal to the adjustable delay time of the second delay signal of the delay circuit unit from the input clock signal, and this delay time is equivalent to the difference of the oscillation periods obtained from the respective oscillation frequencies of the first and second positive feedback loops via the monostable multivibrator to be measured by the oscillation frequency measuring circuit. Therefore, it is possible to measure and adjust the timing of the delay test at a high speed and with a high accuracy.

Here, since the pulse generating circuit of the above-described characteristic does not use the PLL circuit for generation of the pulse signal, the problems 1) to 3) pointed out in Problem for Background Art 2 are solved. Further, although the variable delay circuit is used, the delay time thereof can be measured, and thereby, the problem 4) is solved. In addition, the time difference between the launch clock edge and the capture clock edge can be adjusted by adjusting the delay time of the variable delay circuit, and thereby, the problem 5) is solved. Further, since a ring oscillator to be used for measurement of the delay time is a positive feedback loop using the monostable multivibrator, the sixth and seventh problems are also solved.

Particularly, according to the pulse generating circuit of the fifth characteristic, a signal to be outputted from the selecting circuit can be switched in response to the input of the external control signal such that, in the case that the input clock signal is selected, the signal to be outputted from the selecting circuit can be used as a clock signal for an actual operation of the circuit to be tested being an object of the delay test, and in the case that the pulse signal is selected, the signal to be outputted from the selecting circuit can be used as a launch clock and a capture clock of the delay test of the circuit to be tested.

Particularly, according to the pulse generating circuit of the sixth characteristic, the second pulse signal to be generated by the second pulse generating circuit can be used as a scan enable signal of the circuit to be tested being the object of the delay test.

Moreover, in order to accomplish the above-described fourth object, a semiconductor integrated circuit according to the present invention is a semiconductor integrated circuit capable of conducting a delay test according to a scan path method, and the semiconductor integrated circuit is characterized as the first characteristic by incorporating the pulse generating circuit according to the above-described fifth characteristic therein, and using a signal to be outputted from the selecting circuit as a clock pulse of a circuit to be tested being an object of the delay test according to the scan path method.

Further, a semiconductor integrated circuit according to the present invention is a semiconductor integrated circuit capable of conducting a delay test according to a scan path method, and the semiconductor integrated circuit is characterized as the second characteristic by incorporating the pulse generating circuit according to the above-described sixth characteristic therein, and using a signal to be outputted from the selecting circuit as a clock pulse of the circuit to be tested being the object of the delay test according to the scan path method, and using the second pulse signal to be outputted from the second pulse generating circuit as a scan enable signal of the circuit to be tested.

According to the semiconductor integrated circuit according to the above-described characteristic, since the semiconductor integrated circuit incorporates the pulse generating circuit of the above-described fifth or sixth characteristic, all problems 1) to 7) pointed out in Problem for Background Art 2 are solved. Therefore, it is possible to realize a semiconductor integrated circuit, capable of conducting the delay test according to the scan path method at a high speed and with a high accuracy.

Further, in order to accomplish the above-described fourth object, a testing method of a semiconductor integrated circuit according to the present invention is a testing method of conducting a delay test according to a scan path method on a semiconductor integrated circuit, and the testing method of the semiconductor integrated circuit is characterized as the first characteristic by comprising: using the pulse generating circuit according to the above-described fifth characteristic and using a signal to be outputted from the selecting circuit as a clock pulse of a circuit to be tested being an object of the delay test according to the scan path method.

Moreover, a testing method of a semiconductor integrated circuit according to the present invention is a testing method of conducting a delay test according to a scan path method on a semiconductor integrated circuit, and the testing method of the semiconductor integrated circuit is characterized as the second characteristic by comprising: using the pulse generating circuit according to the above-described sixth characteristic; using a signal to be outputted from the selecting circuit as a clock pulse of a circuit to be tested being an object of the delay test according to the scan path method; and using the second pulse signal to be outputted from the second pulse generating circuit as a scan enable signal of the circuit to be tested.

According to the testing method of the semiconductor integrated circuit of the above-described characteristic, since the testing method uses the pulse generating circuit according to the above-described fifth or sixth characteristic, all problems 1) to 7) pointed out in Problem for Background Art 2 are solved. Therefore, it is possible to conduct the delay test according to the scan path method on the semiconductor integrated circuit at a high speed and with a high accuracy.

Figure 1:
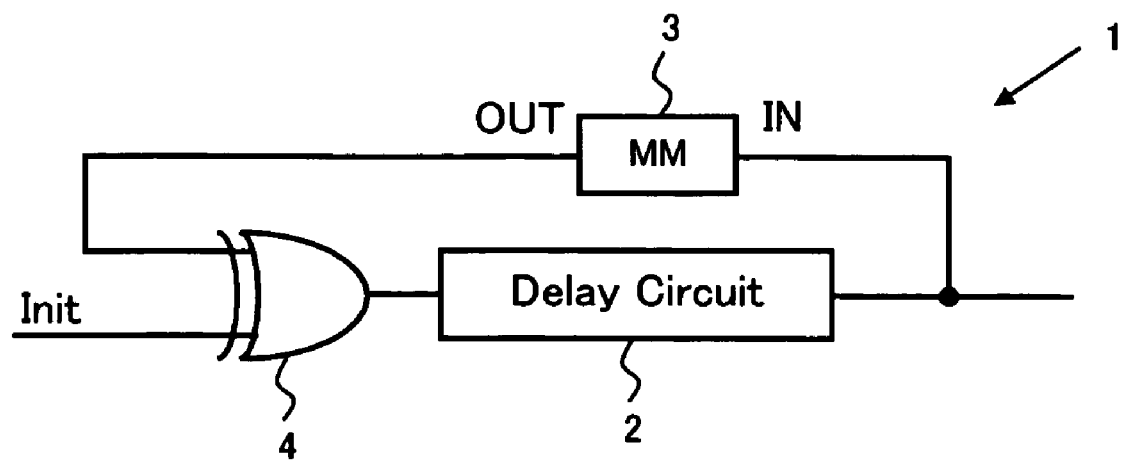
FIG. 1 is a block diagram showing a configuration example of a ring oscillation circuit due to a positive feedback according to the present invention.

EXPLANATION OF REFERENCES 1, 11: Ring oscillation circuit due to positive feedback according to the present invention
2, 12: Delay circuit
3, 13, 22, 53: Monostable multivibrator
4, 14, 23: Oscillation starting circuit
5, 15: D-type flip-flop
6, 16: Inverter line
7, 9, 17, 19: Two input exclusive circuit
8, 60: Oscillation frequency measuring circuit
10, 26: Signal switching circuit
18: Inverter
20: Testing circuit according to the present invention
21, 51, 52, 64, 65: Variable delay circuit
24: Phase comparing circuit (D-type flip-flop)
25: Number counter
27: Frequency measuring circuit
30: Clock generating circuit
31: Phase detector
32: Charge pump circuit
33: Voltage control oscillator (VCO)
34: 1/N frequency divider
40: Image sensor according to the present invention
41: Optical sensor
42: Memory unit
43: Transmission unit
44: Control unit
45: Clock generating circuit
46: Frequency dividing circuit
50, 70: Pulse generating circuit according to the present invention
54, 66: Fixed delay circuit
55: Control circuit
56, 56': Pulse generating circuit
57, 58, 59: Signal selecting circuit
61, 71: Semiconductor integrated circuit according to the present invention
62: Circuit to be tested being object of delay test according to scan path method
63: Second pulse generating circuit
CD1, CD2: Control signal for adjusting delay time
CLKin: Input clock signal CLKout: Output clock signal
CLK0: Input clock signal of delay circuit unit
CLK1: First delay signal
CLK2: Second delay signal
CLK3: Pulse signal (launch and capture clock)
Dfe: Propagation delay time with respect to falling edge of delay circuit
Dre: Propagation delay time with respect to rising edge of delay circuit
Dmff: Delay time with respect to falling edge of monostable multivibrator
Dmrr: Delay time with respect to rising edge of monostable multivibrator
Init: Starting signal
N1: Input node of delay circuit
N2: Output node of delay circuit
P1: Launch operation pulse
P2: Capture operation pulse
RST#: Reset signal
S0: Clock signal of test object
S1: Delay clock signal
S2: Output signal of oscillation starting circuit
S3: Mode switching signal
S4, S5: Signal selecting signal
SE: External control signal
SEout: Second pulse signal (scan enable signal)
Tnf: Period of ring oscillation operation due to negative feedback
Tpf: Period of ring oscillation operation due to positive feedback
Tpw: Pulse width of output pulse of monostable multivibrator
Twh: High level time period of oscillation pulse
Twl: Low level time period of oscillation pulse

BEST MODE FOR CARRYING OUT THE INVENTION

Hereinafter, the embodiments of a ring oscillation circuit, a delay time measuring circuit, a delay time measuring method, a testing circuit and a testing method, a clock generating circuit, an image sensor, a pulse generating circuit, and a semiconductor integrated circuit and a testing method thereof will be described with reference to the drawings.

First Embodiment

FIG. 1 is a block diagram showing a configuration example of a ring oscillation circuit 1 due to a positive feedback according to the present invention. As shown in FIG. 1, the ring oscillation circuit 1 is configured by a positive feedback loop to make the circuit of a delay circuit 2, a monostable multivibrator 3, and an oscillation starting circuit 4. According to the configuration example shown in FIG. 1, the output of the delay circuit 2 is connected to the input of the monostable multivibrator 3, and the output of the monostable multivibrator 3 is connected to the input of the delay circuit 2 via the oscillation starting circuit 4. Any circuit configuration of the circuit delay circuit 2 may be allowed if this circuit generates a signal delay between an input terminal and an output terminal. Particularly, the number of inputs and the number of outputs may be plural. A condition to configure a positive feedback loop is to provide a phase relationship of signals between the input and the output of each of the delay circuit 2, the monostable multivibrator 3, and the oscillation starting circuit 4 so that, a signal of a rising edge or a falling edge is inputted to the input of the delay circuit 2, then, a signal, which makes the circuit of the delay circuit 2, the monostable multivibrator 3, and the oscillation starting circuit 4 and returns to the input of the delay circuit 2, becomes a signal of a rising edge or a falling edge having the same phase as the phase of the inputted signal. For example, the phase relationship of the signal between the input and the output of each circuit is the same phase, namely, a relation to output the signal of the rising edge for the input of the signal of the rising edge. Alternatively, two circuits among the delay circuit 2, the monostable multivibrator 3, and the oscillation starting circuit 4 may have a reverse phase relationship of signals between the input and the output, in other words, these two circuits may be related so as to output a signal of a falling (or a rising) edge with respect to input of a signal of a rising (or a falling) edge.

In FIG. 1, the oscillation starting circuit 4 is configured by an exclusive circuit of two inputs. One input is a starting signal Init of the ring oscillation operation. The oscillation starting circuit 4 is not necessarily needed to be an independent circuit, and may be incorporated within the delay circuit 2 or the monostable multivibrator 3. Accordingly, the oscillation starting circuit 4 can be treated as a part of the delay circuit 2 or the monostable multivibrator 3.

Figure 2:
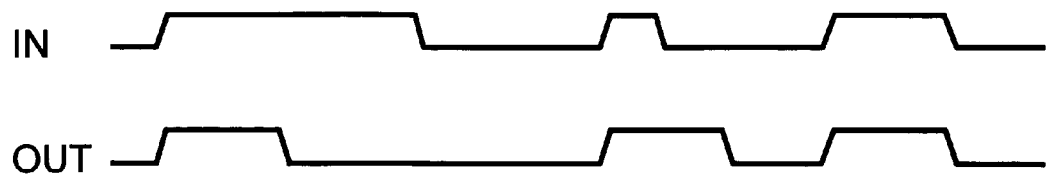
FIG. 2 is a signal waveform view showing a circuit operation example of a monostable multivibrator.

FIG. 2 shows a circuit operation example of the monostable multivibrator 3. In the operation example shown in FIG. 2, a rising pulse of a pulse width for a predetermined time period, which is specific to the circuit, is outputted in response to the rising edge of the input signal. As a monostable multivibrator, other than the above-described operation, the operation for outputting the falling pulse in response to the falling edge of the input signal, the operation for outputting the falling pulse in response to the rising edge of the input signal, and the operation for outputting the rising pulse in response to the falling edge of the input signal may be considered; and in the latter two operations, the phase relationship between the input and the output becomes the reverse phase. In the following explanation, as the monostable multivibrator 3 shown in FIG. 1, one for outputting a rising pulse in response to a rising edge of the input signal is supposed.

Figure 3:
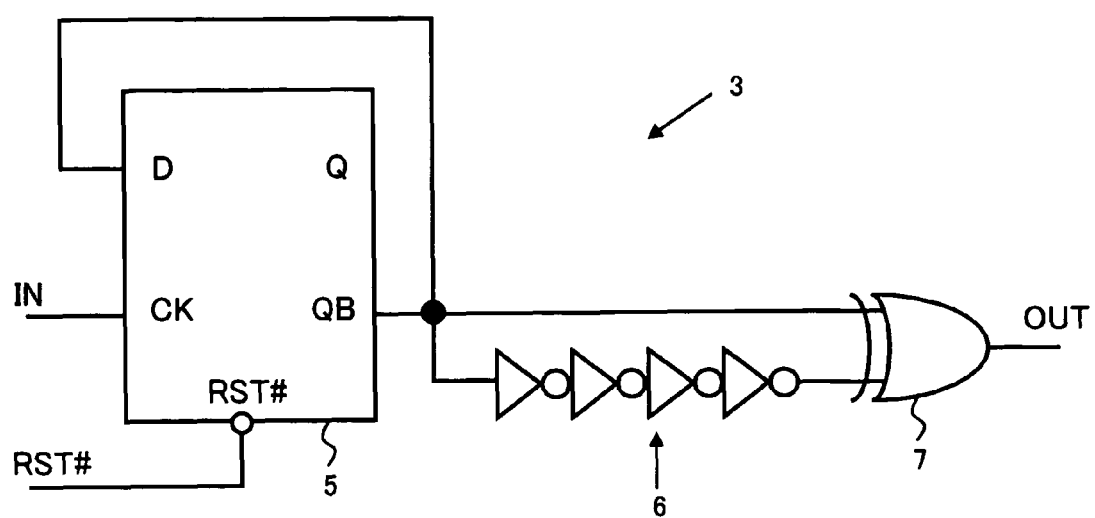
FIG. 3 is a logic circuit diagram showing a circuit operation example of a monostable multivibrator for outputting a rising pulse in response to a rising edge of an input signal.
Figure 4:
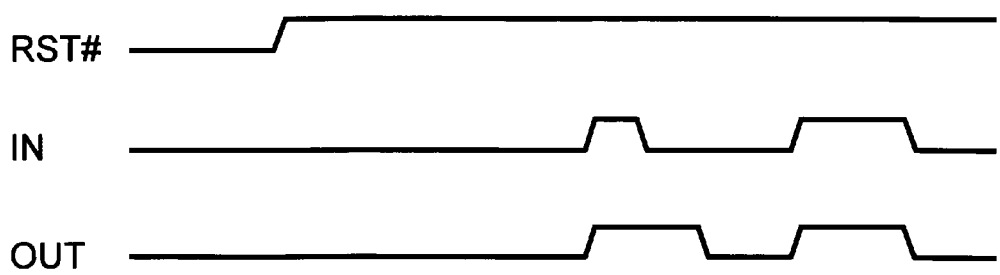
FIG. 4 is a signal waveform view of the monostable multivibrator shown in FIG. 3.

FIG. 3 shows a circuit operation example of a monostable multivibrator for outputting a rising pulse in response to a rising edge of an input signal. In addition, FIG. 4 shows a signal waveform view of the monostable multivibrator shown in FIG. 3. The monostable multivibrator shown in FIG. 3 is configured by a D-type flip-flop 5, an inverter line 6 having even stages, and a two input exclusive circuit 7. In this monostable multivibrator, an input signal IN is inputted into a clock input CK of the D-type flip-flop 5, and a reverse data output QB of the D-type flip-flop 5 is connected to a data input D of the D-type flip-flop 5. When a reset signal RST# is at a high level, the monostable multivibrator is activated to output a rising pulse OUT in response to the rising edge of the input signal IN.

Figure 5:
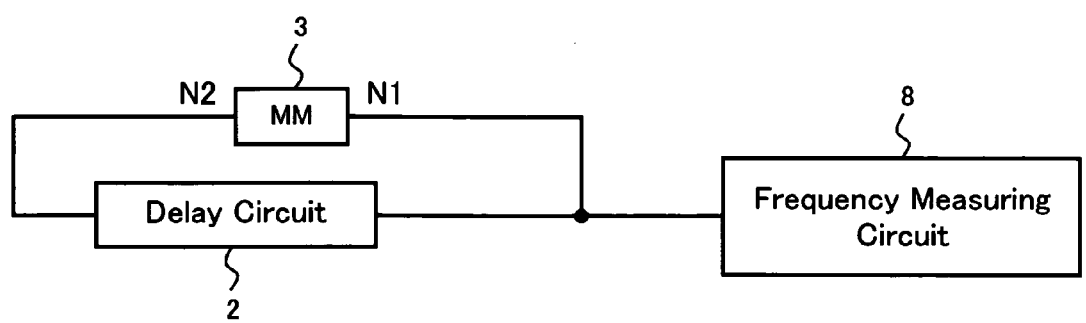
FIG. 5 is a block diagram showing a schematic block configuration of a ring oscillation circuit due to a positive feedback according to the present invention.
Figure 6:
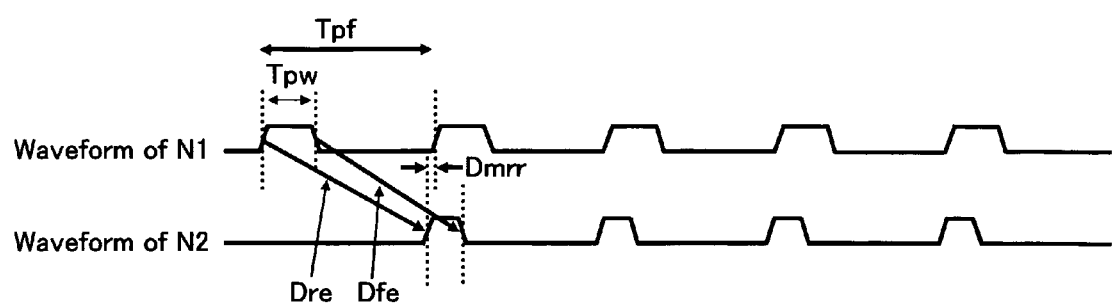
FIG. 6 is a voltage waveform view showing an oscillation waveform in an input node and an output node of a delay circuit in a ring oscillation operational state in the ring oscillation circuit shown in FIG. 5.

With reference to FIG. 5 and FIG. 6, the ring oscillation operation due to a positive feedback using the monostable multivibrator will be described. FIG. 5 is a pattern diagram of the ring oscillation circuit 1 according to the present invention, and the input of a frequency measuring circuit 8 for measuring the oscillation period of the ring oscillation circuit 1 is connected to an output node N2 of the delay circuit 2 on a positive feedback loop. FIG. 6 shows the signal waveforms in the input node N1 and the output node N2 of the delay circuit 2 during the oscillation operation of the ring oscillation circuit 1 shown in FIG. 5. The ring oscillation circuit 1 shown in FIG. 5 utilizes the monostable multivibrator 3 for outputting a rising pulse in response to the rising edge of the input signal.

The rising pulse, which is applied to the input node N1 of the delay circuit 2, is outputted as the rising pulse of the same phase to the output node N2 after the delay time of the delay circuit 2 has passed. The rising edge of the rising pulse of this output node N2 allows the monostable multivibrator 3 to be operated to output the rising pulse of a predetermined pulse width, which is defined by the monostable multivibrator 3, and then, the monostable multivibrator 3 applies this pulse to the input node N1. Further, by repeating the circulating operation such that the rising pulse applied from the monostable multivibrator 3 attains to the output node N2 with the same phase after the delay time of the delay circuit 2 has passed to operate the monostable multivibrator 3, the ring oscillation operation due to the positive feedback is carried out.

Here, when the rising pulse is propagated from the input node N1 to the output node N2, the pulse width (the high level time period) is contracted due to the time difference between the propagation delay time with respect to the rising edge of delay circuit Dre and the propagation delay time with respect to the falling edge of delay circuit Dfe. In other words, if the propagation delay time Dre is longer than the propagation delay time Dfe, the pulse width becomes shorter, and on the contrary, if the propagation delay time Dre is shorter than the propagation delay time Dfe, the pulse width becomes longer.

However, in the ring oscillation circuit 1 according to the present invention, every time the rising pulse, of which pulse width is changed, is inputted from the output node N2, the monostable multivibrator 3 outputs the rising pulse of a predetermined pulse width Tpw to the input node N1, and thereby, a problem such that the pulse width is changed every time the pulse signal makes the circuit of the positive feedback loop due to the time difference between the propagation delay time Dre and the propagation delay time Dfe in the ring oscillation operation of the conventional positive feedback loop without using a monostable multivibrator and a pulse signal disappears can be avoided. In other words, in the ring oscillation circuit 1 according to the present invention, the monostable multivibrator 3 plays a roll to maintain a pulse width constant by preventing the pulse width due to the time difference of the propagation delay time Dre and the propagation delay time Dfe from being changed monotonically and cumulatively.

Here, in order for the positive feedback loop to retain the ring oscillation operation, it is a condition that the output pulse of the delay circuit 2 when the monostable multivibrator 3 inputs the output pulse to be generated into the delay circuit 2 can activate the monostable multivibrator 3. Before the rising edge of the output pulse of the monostable multivibrator 3 is inputted into the delay circuit 2, the output pulse before one period is needed to fall. In other words, it is necessary for a predetermined pulse width of the output pulse of the monostable multivibrator 3 to be set shorter than one period of the ring oscillation operation. Further, in the case that the propagation delay time Dre is longer than the propagation delay time Dfe (Dre>Dfe), since the output pulse width of the monostable multivibrator 3 becomes shorter by the difference between the propagation delay times (Dre−Dfe) when the pulse signal passes through the delay circuit 2, the output pulse width is set to be longer than the difference between the propagation delay times (Dre−Dfe). In addition, in the case that the propagation delay time Dre is shorter than the propagation delay time Dfe (Dre<Dfe), since the output pulse width of the monostable multivibrator 3 becomes longer by the difference between the propagation delay times (Dfe−Dre) when the pulse signal passes through the delay circuit 2, the sum of the output pulse width and the difference between the propagation delay times (Dfe−Dre) is set to be shorter than one period of the ring oscillation operation. The period Tpf of the ring oscillation operation due to the positive feedback, as shown in the following mathematical expression 9, becomes the sum of the propagation delay time Dre with respect to the rising edge of the delay circuit 2 and a delay time Dmrr from the rising edge of the input of the monostable multivibrator 3 up to the rising edge of the output pulse.

$$Tpf = Dre + Dmrr \qquad \text{Mathematical Expression 9}$$

If a positive feedback loop including the delay circuit 2 is configured by using the monostable multivibrator 3 for outputting the rising pulse of the pulse width of a predetermined time period, which is specific to the circuit, in response to the rising edge of the input signal, it is possible to develop the propagation delay time Dre with respect to the rising edge of the delay circuit 2 from a relational expression of the mathematical expression 9. In other words, the propagation delay time Dre can be obtained by deducting the delay time Dmrr of the monostable multivibrator 3 from the period Tpf of the ring oscillation operation due to the positive feedback. As a result, a delay time measuring circuit, which can directly measure the propagation delay time Dre with respect to the rising edge of an arbitrary delay circuit, can be configured by connecting the delay circuit 2 as the circuit to be measured and the monostable multivibrator 3 to each other so as to configure a positive feedback loop, in other words, connecting them to each other as shown in FIG. 1 or FIG. 5, starting the ring oscillation operation due to the positive feedback, measuring the oscillation frequency of the ring oscillation operation due to the positive feedback or the oscillation period Tpf, which is an inverse number, by means of the frequency measuring circuit 8, and measuring the propagation delay time Dre from a measurement result of the frequency measuring circuit 8, namely, from the oscillation frequency or the oscillation period Tpf.

Figure 7:
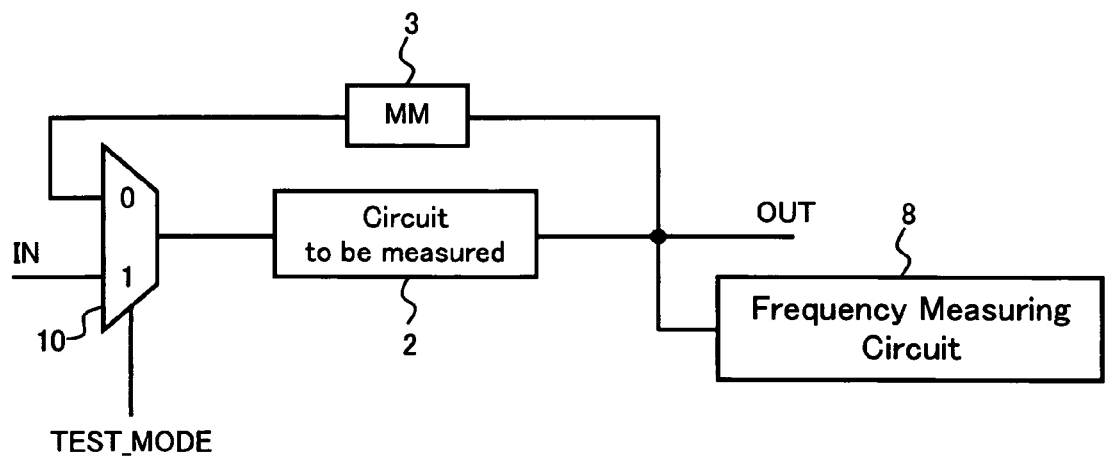
FIG. 7 is a block diagram showing a configuration example of a delay time measuring circuit according to the present invention.

FIG. 7 shows an example of a circuit configuration of a delay time measuring circuit, which allows the delay circuit 2 as the circuit to be measured to be available by switching a normal operational mode and a delay time measuring mode. According to the example of the circuit configuration shown in FIG. 7, a signal switching circuit 10 for switching a signal to be inputted into the delay circuit 2 between the normal operational mode and the delay time measuring mode is provided.

Figure 8:
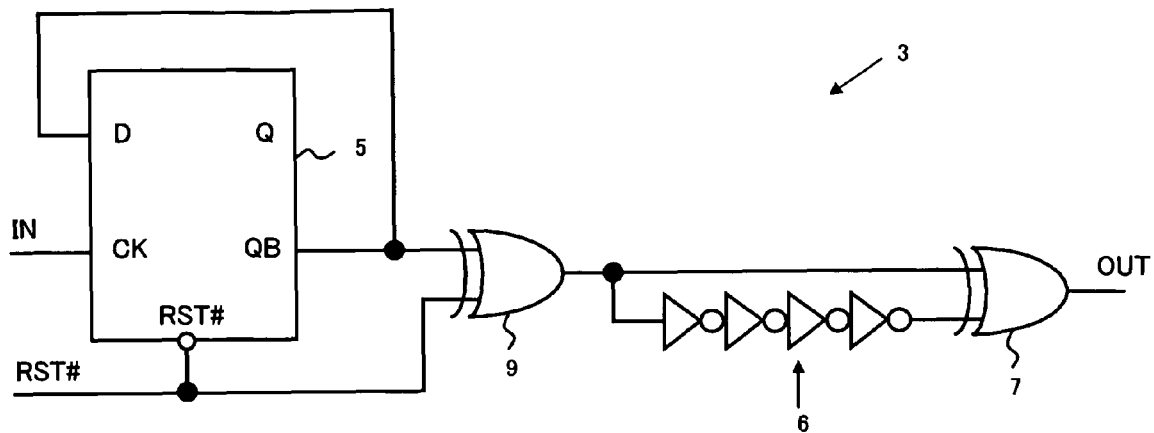
FIG. 8 is a logic circuit diagram showing a circuit configuration example of a monostable multivibrator, incorporating a function of an oscillation starting circuit therein.
Figure 9:
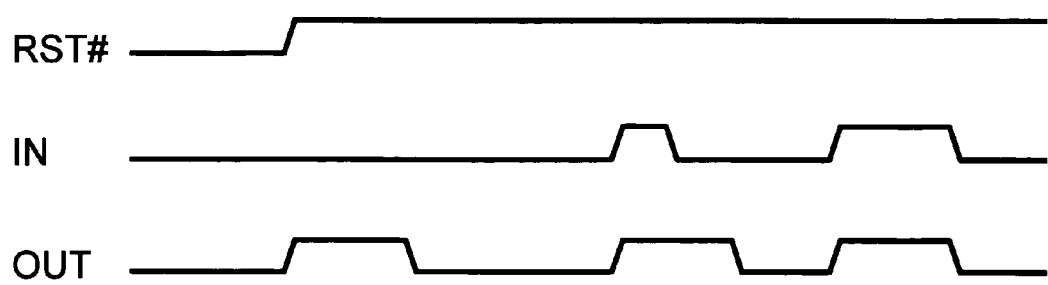
FIG. 9 is a signal waveform view of the monostable multivibrator shown in FIG. 8.

Next, FIG. 8 shows an example of a circuit configuration of the monostable multivibrator 3 incorporating a function of the oscillation starting circuit 4 illustrated in FIG. 1. In addition, FIG. 9 shows a signal waveform view of the monostable multivibrator shown in FIG. 8. In the monostable multivibrator shown in FIG. 8, a two input exclusive circuit 9 is inserted in a rear stage of a connection point between the reverse data output QB of the D-type flip-flop 5 and the data input D of the D-type flip-flop 5; one input of the two input exclusive circuit 9 is connected to the reverse data output QB of the D-type flip-flop 5 and other input is connected to the reset signal RST#; and the output is connected to one input of the two input exclusive circuit 7 and the input of the inverter line 6. Other circuit configuration is the same as the monostable multivibrator shown in FIG. 3. The monostable multivibrator shown in FIG. 8 has the circuit configuration such that the reset signal RST# functions as a starting signal and outputs the rising pulse for starting once upon rising of the reset signal RST# (when the initialization is completed). This initial pulse becomes a trigger signal for starting the ring oscillation operation, which is capable of starting the ring oscillation operation at the same time as release of resetting. Using this monostable multivibrator can solve the above-described two problems in the ring oscillation operation due to a conventional positive feedback, namely, a point such that "the oscillation operation is not started spontaneously" and a point such that "even if the oscillation operation is started once, immediately attaining to a stable state, the operation stops" at the same time, so that it becomes unnecessary to prepare a separate oscillation starting circuit on the positive feedback loop independently.

Second Embodiment

Figure 10:
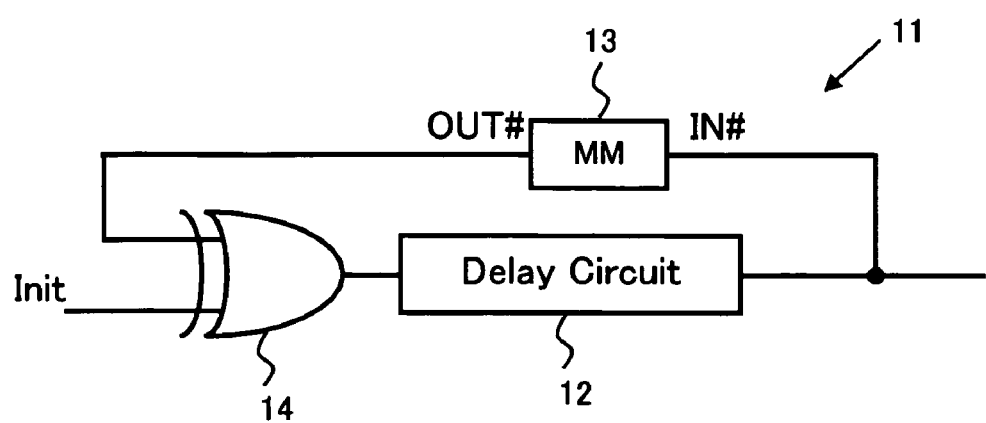
FIG. 10 is a block diagram showing a schematic block configuration of a ring oscillation circuit due to a positive feedback according to the present invention.

Next, a ring oscillation circuit using a monostable multivibrator for outputting a falling pulse in response to a falling edge of an input signal will be described. FIG. 10 shows a ring oscillation circuit 11 using a monostable multivibrator 13, which is operated in response to the falling edge. The ring oscillation circuit 11 is configured by a positive feedback loop making the circuit of a delay circuit 12, the monostable multivibrator 13, and an oscillation starting circuit 14. The circuit configuration itself is the same as the circuit configuration shown in FIG. 1, so that the explanation overlapping between them is herein omitted.

Figure 11:
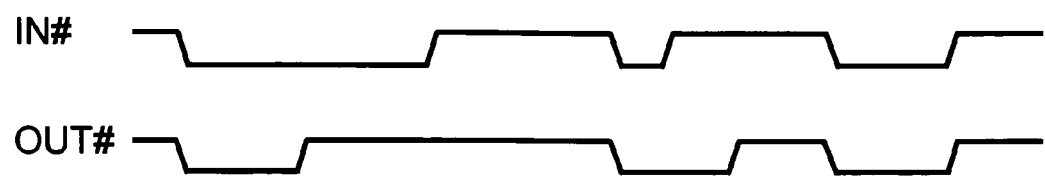
FIG. 11 is a voltage waveform view showing an oscillation waveform in an input node and an output node of a delay circuit in a ring oscillation operational state in the ring oscillation circuit shown in FIG. 10.

FIG. 11 shows an example of the circuit operation of the monostable multivibrator 13. In the operation example shown in FIG. 11, in response to a falling edge of the input signal, a falling pulse with a pulse width for a predetermined time period, which is specific to a circuit, is outputted.

Figure 12:
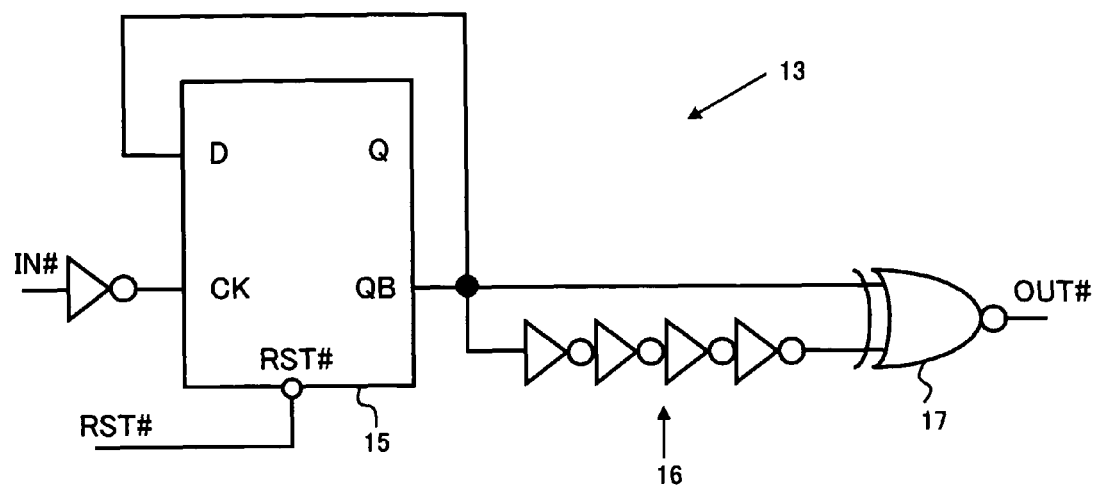
FIG. 12 is a logic circuit diagram showing a circuit configuration example of a monostable multivibrator for outputting a falling pulse in response to a falling edge of an input signal.
Figure 13:
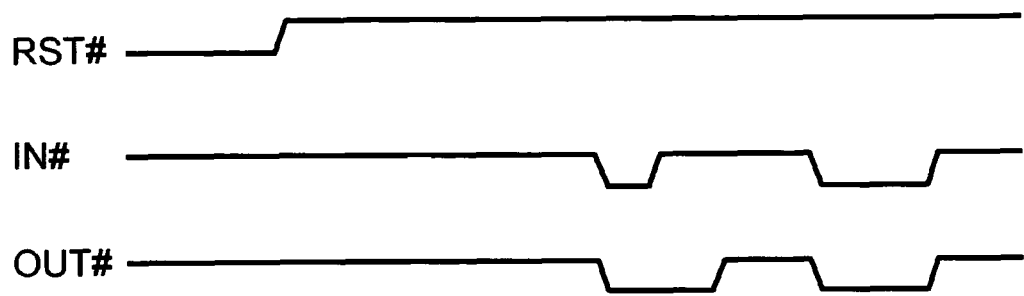
FIG. 13 is a signal waveform view of the monostable multivibrator shown in FIG. 12.

FIG. 12 shows a circuit example of a monostable multivibrator for outputting a falling pulse in response to a falling edge of an input signal. In addition, FIG. 13 shows a signal waveform of the monostable multivibrator shown in FIG. 12. The monostable multivibrator shown in FIG. 12 is configured by a D-type flip-flop 15, an inverter line having even stages 16, a two input exclusive circuit 17, and an inverter 18. In this monostable multivibrator, an input signal IN# reversed by the inverter 18 is inputted into a clock input CK of the D-type flip-flop 15, and a reverse data output QB of the D-type flip-flop 15 is connected to a data input D of the D-type flip-flop 15. When a reset signal RST# is at a high level, the monostable multivibrator is activated to output a falling pulse OUT# in response to the falling edge of the input signal IN#.

Figure 14:
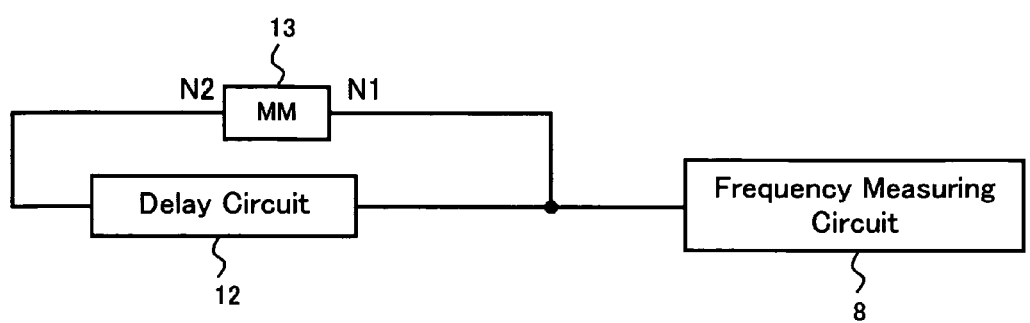
FIG. 14 is a block diagram showing a schematic block configuration of a ring oscillation circuit due to a positive feedback according to the present invention.
Figure 15:
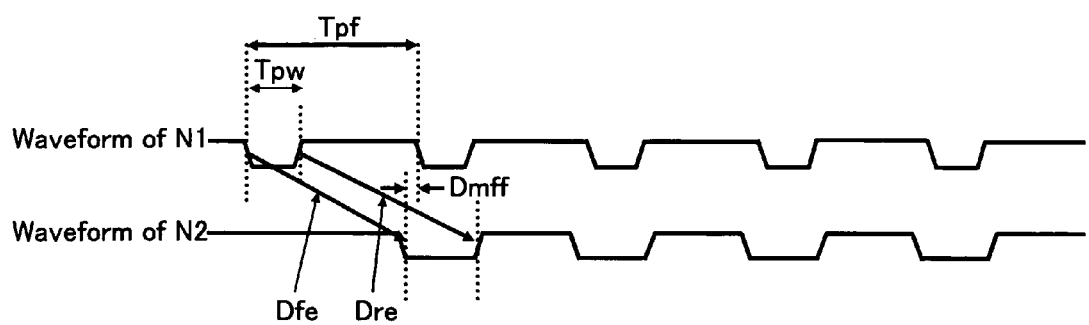
FIG. 15 is a voltage waveform view showing an oscillation waveform in an input node and an output node of a delay circuit in a ring oscillation operational state in the ring oscillation circuit shown in FIG. 14.

With reference to FIG. 14 and FIG. 15, the ring oscillation operation due to a positive feedback using the monostable multivibrator 13, which is operated in response to a falling edge of an input signal, will be described. FIG. 14 is a pattern diagram of the ring oscillation circuit 11 according to the present invention, and the input of a frequency measuring circuit 8 for measuring the oscillation period of the ring oscillation circuit 11 is connected to an output node N2 of the delay circuit 12 on a positive feedback loop. FIG. 15 shows the signal waveforms in the input node N1 and the output node N2 of the delay circuit 12 during the oscillation operation of the ring oscillation circuit 11 shown in FIG. 14. The ring oscillation circuit 11 shown in FIG. 14 utilizes the monostable multivibrator 13 for outputting a falling pulse in response to the falling edge of the input signal.

The rising pulse, which is applied to the input node N1 of the delay circuit 12, is outputted as the falling pulse of the same phase to the output node N2 after the delay time of the delay circuit 12 has passed. The falling edge of the falling pulse of this output node N2 allows the monostable multivibrator 13 to be operated to output the falling pulse of a predetermined pulse width, which is defined by the monostable multivibrator 13, and then, the monostable multivibrator 13 applies this pulse to the input node N1. Further, by repeating the circulating operation such that the falling pulse applied from the monostable multivibrator 13 attains to the output node N2 with the same phase after the delay time of the delay circuit 12 has passed to operate the monostable multivibrator 13, the ring oscillation operation due to the positive feedback is carried out.

Here, when the falling pulse is propagated from the input node N1 to the output node N2, the pulse width (the low level time period) is contracted due to the time difference between the propagation delay time with respect to the rising edge of delay circuit Dre and the propagation delay time with respect to the falling edge of delay circuit Dfe. In other words, if the propagation delay time Dre is longer than the propagation delay time Dfe, the pulse width becomes shorter, and on the contrary, if the propagation delay time Dre is shorter than the propagation delay time Dfe, the pulse width becomes longer.

However, in the ring oscillation circuit 11 according to the present invention, every time the falling pulse, of which pulse width is changed, is inputted from the output node N2, the monostable multivibrator 13 outputs the falling pulse of a predetermined pulse width Tpw to the input node N1, and thereby, a problem such that the pulse width is changed every time the pulse signal makes the circuit of the positive feedback loop due to the time difference between the propagation delay time Dre and the propagation delay time Dfe in the ring oscillation operation of the conventional positive feedback loop without using a monostable multivibrator and a pulse signal disappears can be avoided. In other words, in the ring oscillation circuit 11 according to the present invention, the monostable multivibrator 13 plays a roll to maintain a pulse width constant by preventing the pulse width due to the time difference of the propagation delay time Dre and the propagation delay time Dfe from being changed monotonically and cumulatively.

Here, in order for the positive feedback loop to retain the ring oscillation operation, it is a condition that the output pulse of the delay circuit 12 when the monostable multivibrator 13 inputs the output pulse to be generated into the delay circuit 12 can activate the monostable multivibrator 13. Before the falling edge of the output pulse of the monostable multivibrator 13 is inputted into the delay circuit 12, it is necessary for the output pulse before one period to rise up. In other words, it is necessary for a predetermined pulse width of the output pulse of the monostable multivibrator 13 to be set shorter than one period of the ring oscillation operation. The period Tpf of the ring oscillation operation due to the positive feedback, as shown in the following mathematical expression 10, becomes the sum of the propagation delay time Dfe with respect to the falling edge of the delay circuit 12 and a delay time Dmff from the falling edge of the input of the monostable multivibrator 13 up to the falling edge of the output pulse.

$$Tpf = Dfe + Dmff \qquad \text{Mathematical Expression 10}$$

If a positive feedback loop including the delay circuit 12 is configured by using the monostable multivibrator 13 for outputting the falling pulse of the pulse width of a predetermined time period, which is specific to the circuit, in response to the falling edge of the input signal, it is possible to develop the propagation delay time Dfe with respect to the falling edge of the delay circuit 12 from a relational expression of the mathematical expression 10. In other words, the propagation delay time Dfe can be obtained by deducting the delay time Dmff of the monostable multivibrator 13 from the period Tpf of the ring oscillation operation due to the positive feedback. As a result, a delay time measuring circuit, which can directly measure the propagation delay time Dfe with respect to the falling edge of an arbitrary delay circuit, can be configured by connecting the delay circuit 12 as the circuit to be measured and the monostable multivibrator 13 to each other so as to configure a positive feedback loop, in other words, connecting them to each other as shown in FIG. 10 or FIG. 14, starting the ring oscillation operation due to the positive feedback, measuring the oscillation frequency of the ring oscillation operation due to the positive feedback or the oscillation period Tpf, which is an inverse number by means of the frequency measuring circuit 8, and measuring the propagation delay time Dfe from a measurement result of the frequency measuring circuit 8, namely, from the oscillation frequency or the oscillation period Tpf.

Figure 16:
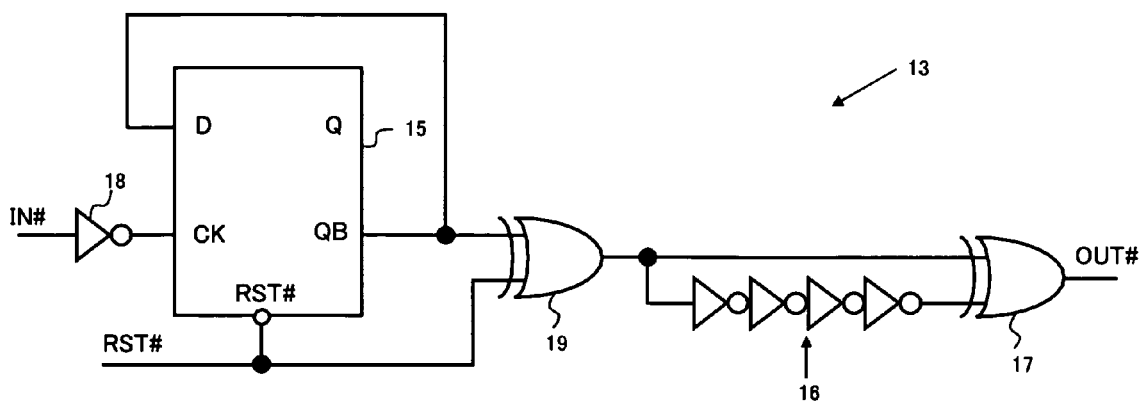
FIG. 16 is a logic circuit diagram showing a circuit configuration example of a monostable multivibrator, incorporating a function of an oscillation starting circuit therein.
Figure 17:
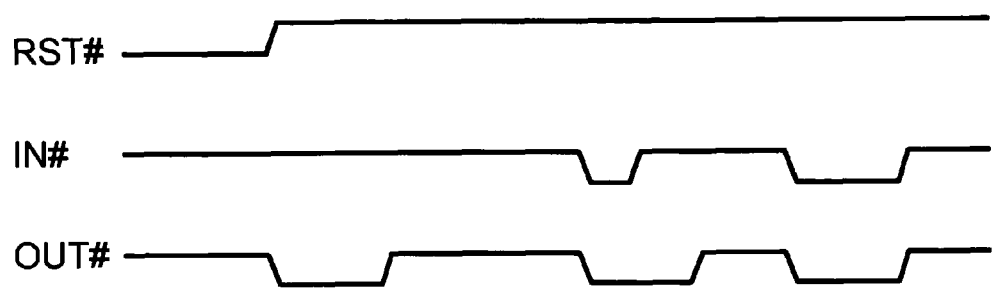
FIG. 17 is a signal waveform view of the monostable multivibrator shown in FIG. 16.

Next, FIG. 16 shows an example of a circuit configuration of the monostable multivibrator 13 incorporating a function of the oscillation starting circuit 14 illustrated in FIG. 10. In addition, FIG. 17 shows a signal waveform view of the monostable multivibrator shown in FIG. 16. In the monostable multivibrator shown in FIG. 16, a two input exclusive circuit 19 is inserted in a rear stage of a connection point between the reverse data output QB of the D-type flip-flop 15 and the data input D of the D-type flip-flop 15, one input of the two input exclusive circuit 19 is connected to the reverse data output QB of the D-type flip-flop 15 and other input is connected to the reset signal RST#; and the output is connected to one input of the two input exclusive circuit 17 and the input of the inverter line 16. Other circuit configuration is the same as the monostable multivibrator shown in FIG. 12. The monostable multivibrator shown in FIG. 16 has the circuit configuration such that the reset signal RST# functions as a starting signal and the falling pulse for starting is outputted once upon rising of the reset signal RST# (when the initialization is completed). This initial pulse becomes a trigger signal for starting the ring oscillation operation, which is capable of starting the ring oscillation operation at the same time as release of resetting. Using this monostable multivibrator, the above-described two problems in the ring oscillation operation due to a conventional positive feedback, namely, a point such that "the oscillation operation is not started spontaneously" and a point such that "even if the oscillation operation is started once, immediately attaining to a stable state, the operation stops" can be solved at the same time, so that it becomes unnecessary to prepare a separate oscillation starting circuit on the positive feedback loop independently.

Third Embodiment

Next, a testing circuit according to the present invention for evaluating a timing accuracy of a clock signal will be described. The testing circuit according to the present invention serves to measure the timing accuracy by applying a ring oscillation circuit due to a positive feedback according to the present invention, which is explained with reference to the first or the second embodiment.

Figure 18:
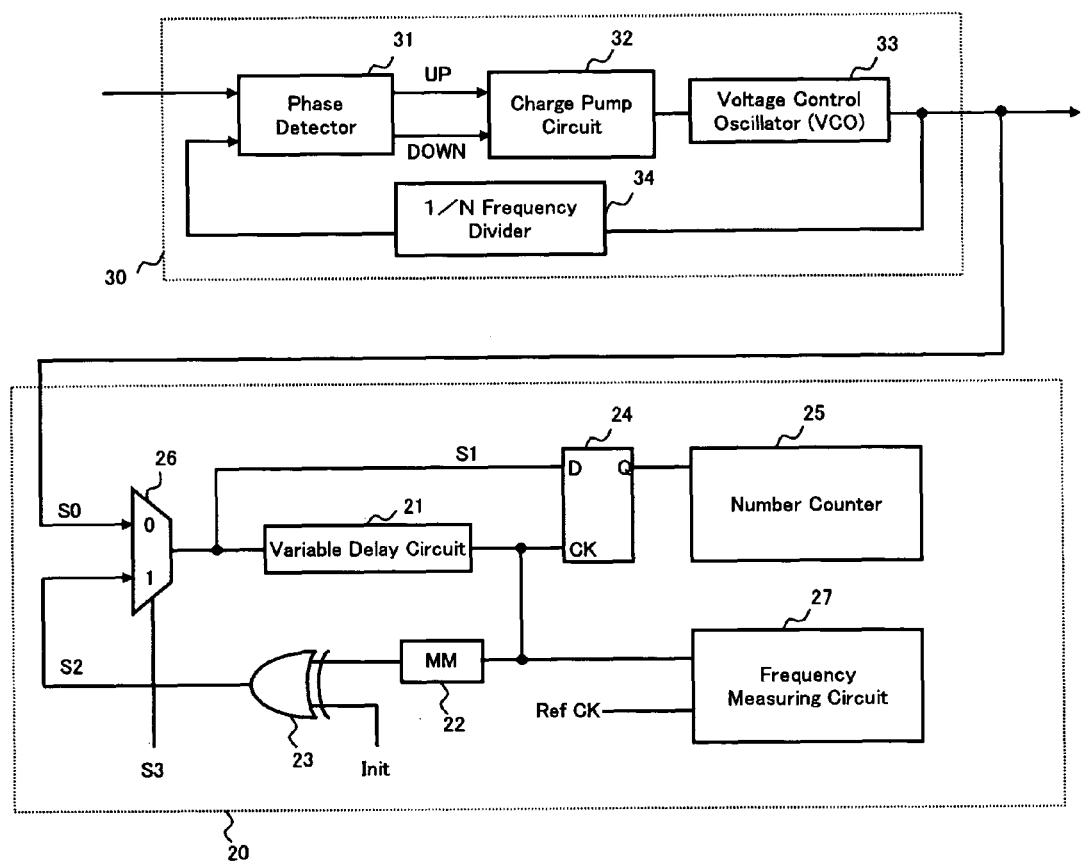
FIG. 18 is a block diagram showing a schematic block configuration of an embodiment of a testing circuit according to the present invention together with a clock generating circuit for generating a clock signal of a test object.

FIG. 18 is a block diagram showing a circuit configuration of a testing circuit 20 according to the present invention and a circuit configuration when a clock generating circuit 30 for generating a clock signal S0, which is an evaluation object by the testing circuit 20, is configured by a PLL circuit. According to the present embodiment, the case such that the testing circuit 20 and the clock generating circuit 30 are formed on the same semiconductor substrate to be incorporated in one LSI chip is supposed.

As shown in FIG. 18, testing circuit 20 is configured by a variable delay circuit 21, which can control a delay time; a monostable multivibrator 22, an oscillation starting circuit 23, a phase comparing circuit 24, a number counter 25, a signal switching circuit 26, and a frequency measuring circuit 27.

The phase comparing circuit 24 is a circuit for comparing the phase of the clock signal S0, which is the testing object, with the phase of a delay clock signal S1, which is delayed by the delay circuit 21, and according to the present embodiment, the phase comparing circuit 24 is configured by the D-type flip-flop. Specifically, the clock signal S0 is inputted into a data input terminal D of the D-type flip-flop, the delay clock signal S1 is inputted into a clock input terminal CK of the D-type flip-flop, and a data output terminal Q of the D-type flip-flop is connected to the input of the number counter 25. According to this configuration, depending on whether the delay clock signal S1 is delayed from the clock signal S0 by one period or by half period, the D-type flip-flop 24 determines an anteroposterior relation between the rising or the falling timing of the clock signal S0 and the rising or the falling timing of the delay clock signal S1, as a determination result, latches the data "0" or "1" in synchronization with the delay clock signal S1, and then, outputs it from the data output terminal Q.

The number counter 25 counts the number of times of one determination result (for example, the data "1") of phase comparison results of a predetermined number of times (for example, several ten thousands times) for each of a plurality of delay time setting values to be changed step by step in the phase comparing circuit 24, and adds up the number of times thereof in the jitter measuring mode.

The signal switching circuit 26 is a switching circuit for switching a jitter measuring mode and a ring oscillation mode on the basis of a mode switching signal S3 from the outside, and in the jitter measuring mode, the signal switching circuit 26 selects the clock signal S0 among the two input signals, and then, inputs it in the variable delay circuit 21 and the number counter 25. In addition, in the ring oscillation mode, the signal switching circuit 26 selects the output signal S2 of the oscillation starting circuit 23 among the two input signals, and inputs it in the variable delay circuit 21 and the number counter 25. According to the present embodiment, the number of stages of the inverter in a signal path of the variable delay circuit 21 is set at an even number, and the monostable multivibrator 22 for outputting a rising pulse in response to a rising edge of an input signal is used, and in the ring oscillation mode a feedback loop to be formed by the variable delay circuit 21, the monostable multivibrator 22, the oscillation starting circuit 23, and the signal switching circuit 26 becomes a positive feedback loop.

The frequency measuring circuit 27 measures an oscillation frequency of a ring oscillator (a positive feedback loop), which is formed by the signal switching circuit 26, in the ring oscillation mode with respect to a predetermined delay time setting value of the variable delay circuit 21. From the measured oscillation frequency, for example, an actual delay time with respect the delay time setting value, which is specified in the jitter measuring mode, can be developed.

Next, a measuring accuracy when the jitter of the clock signal S0 is measured by using the testing circuit 20 according to the present invention will be described as compared to the case of using measurement of a delay time of a variable delay circuit due to a ring oscillation operation due to a negative feedback, which is disclosed in Patent Document 1. Further, a procedure itself of measurement of the jitter is the same as the above-described calculation procedure, which is disclosed in Patent Document 1. In addition, a jitter measuring error $\Delta$ in a conventional jitter measuring is as shown in the mathematical expression 8. In this procedure of measurement of the jitter, a method of developing the delay times Dmax and Dmin of the variable delay circuit in a developing expression of the jitter of the mathematical expression 3 is different from a conventional measuring procedure.

Assuming that a jitter to be measured by using the testing circuit 20 according to the present invention is J2, a jitter J2 is given by the following mathematical expression 11.

$$J2 = T\max - T\min$$
$$= (D\max r + Dmrr) -$$
$$(D\min r + Dmrr)$$
$$= D\max r - D\min r$$

Mathematical Expression 11

Figure 22:
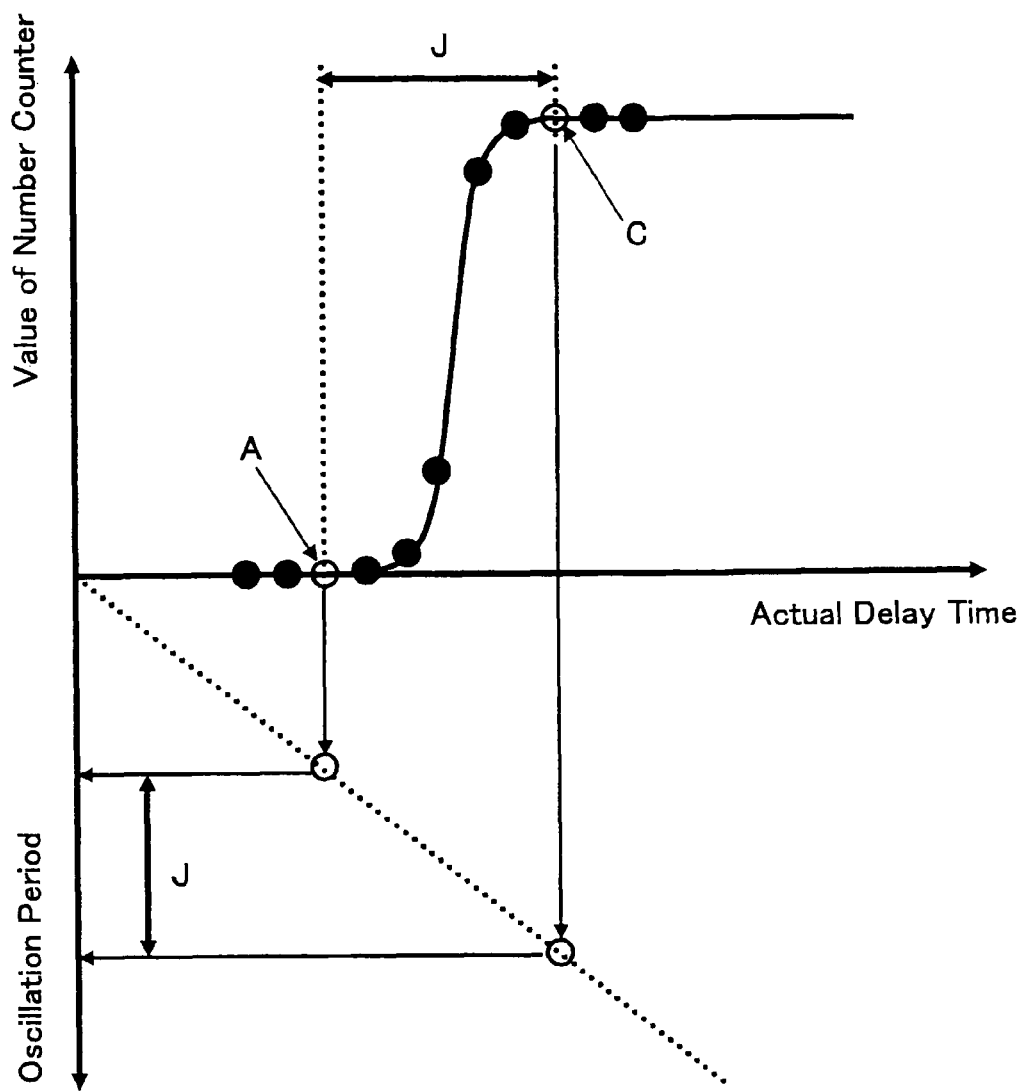
FIG. 22 is a view more specifically explaining the measuring method of the jitter using the testing circuit disclosed in Patent Document 1.
Figure 23:
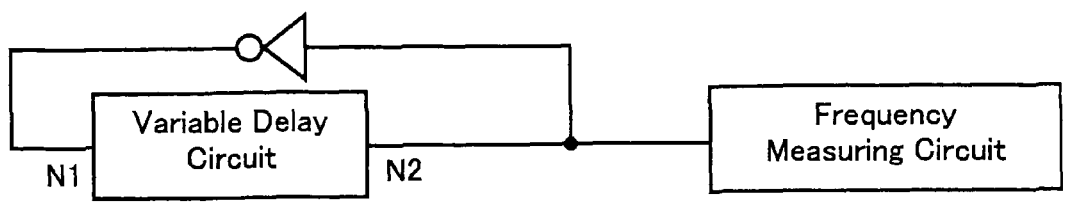
FIG. 23 is a pattern diagram of a measuring circuit for measuring a delay time of a variable delay circuit by using a conventional ring oscillation circuit due to a negative feedback.
Figure 24:
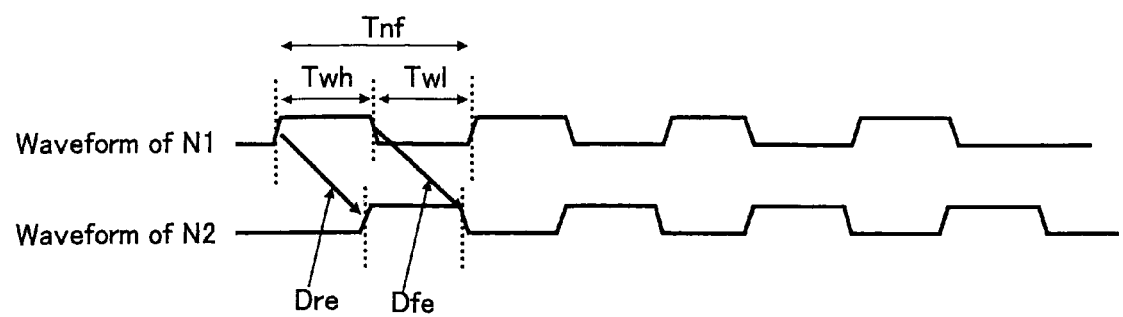
FIG. 24 is a voltage waveform view showing oscillation waveforms in the input node and the output node of the variable delay circuit in the ring oscillation operational state in the conventional measuring circuit shown in FIG. 23.
Figure 25:
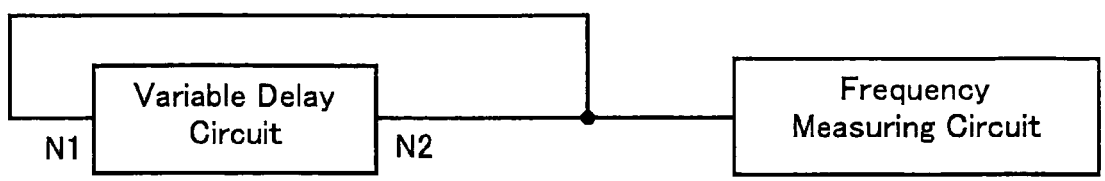
FIG. 25 is a pattern diagram of a measuring circuit for measuring a delay time of a variable delay circuit by using a conventional ring oscillation circuit due to a positive feedback.
Figure 26:
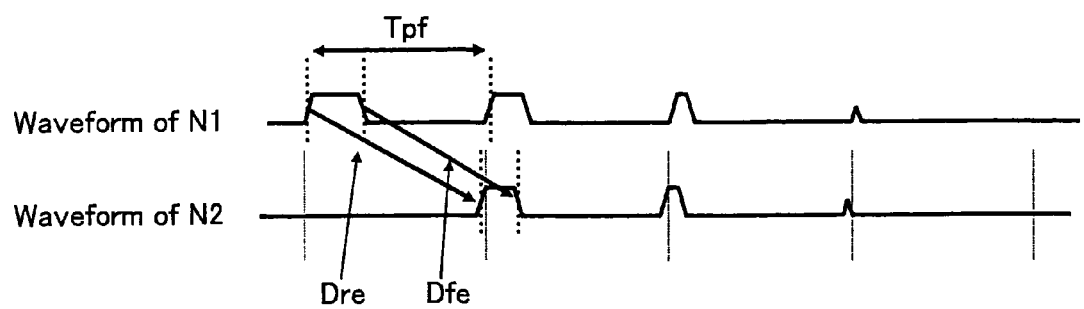
FIG. 26 is a voltage waveform view showing oscillation waveforms in the input node and the output node of the variable delay circuit in the ring oscillation operational state in the conventional measuring circuit shown in FIG. 25.

Tmax in the derivation expression of the mathematical expression 11 represents an oscillation period of the ring oscillation operation at the time of setting a delay time value of a variable delay circuit at a C point shown in FIG. 22, and Tmin represents an oscillation period of the ring oscillation operation at the time of setting a delay time value of a variable delay circuit at an A point shown in FIG. 22. Since an actual jitter J0 to be originally measured is equal to a jitter J2 to be obtained from the above-described mathematical expression 11 as shown in the mathematical expression 7, it is known that a jitter J2 to be measured by using the testing circuit 20 according to the present invention can be measured with a high accuracy without being influenced by the difference between the rising edge propagation time and the falling edge propagation time of the variable delay circuit.

In addition, in the mathematical expression 11, from the fact that the delay time Dmrr of the monostable multivibrator 22 is cancelled, it can be seen that no influence is given to the measurement accuracy of the jitter.

Finally, the circuit configuration of a clock generating circuit 30 shown in FIG. 18 will be briefly described. The clock generating circuit 30 is configured by a popular PLL circuit, and is provided with a phase detector 31, a charge pump circuit 32, a voltage control oscillator (VCO) 33, and a 1/N frequency divider 34. The phase detector 31 detects a phase difference between the inputted reference clock signal CL0 and a signal obtained by dividing an output signal S0 to be outputted from the VCO 33 by the 1 1N frequency divider 34 into 1/N to control high and low of the output voltage of the charge pump circuit 32 on the basis of this phase difference. The VCO 33 adjusts an oscillation frequency in response to the output voltage of the charge pomp circuit 32, and as a result, outputs the output signal S0, which is obtained by multiplying the frequency of the reference clock signal CL0 by N.

Fourth Embodiment

Figure 19:
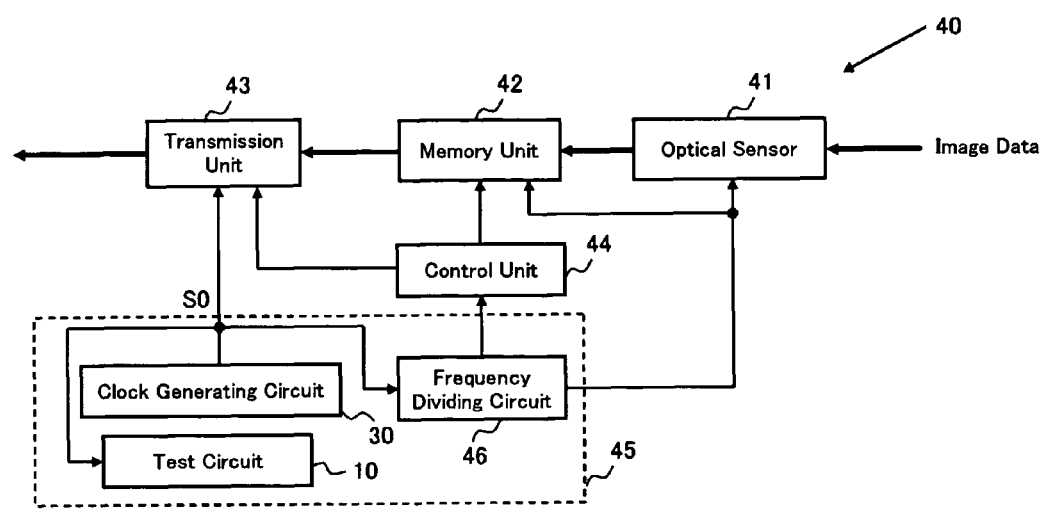
FIG. 19 is a block diagram showing a schematic block configuration of an embodiment of an image sensor according to the present invention.
Figure 20:
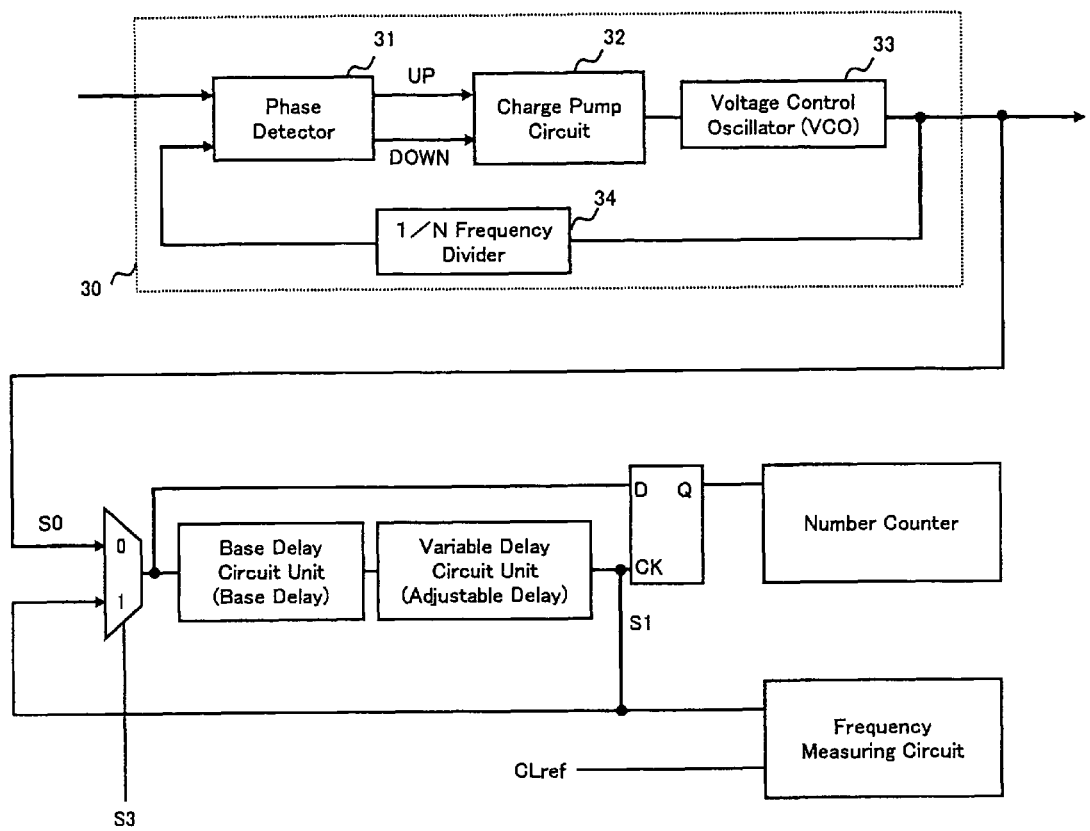
FIG. 20 is a block diagram showing a testing circuit disclosed in Patent Document 1.
Figure 21:
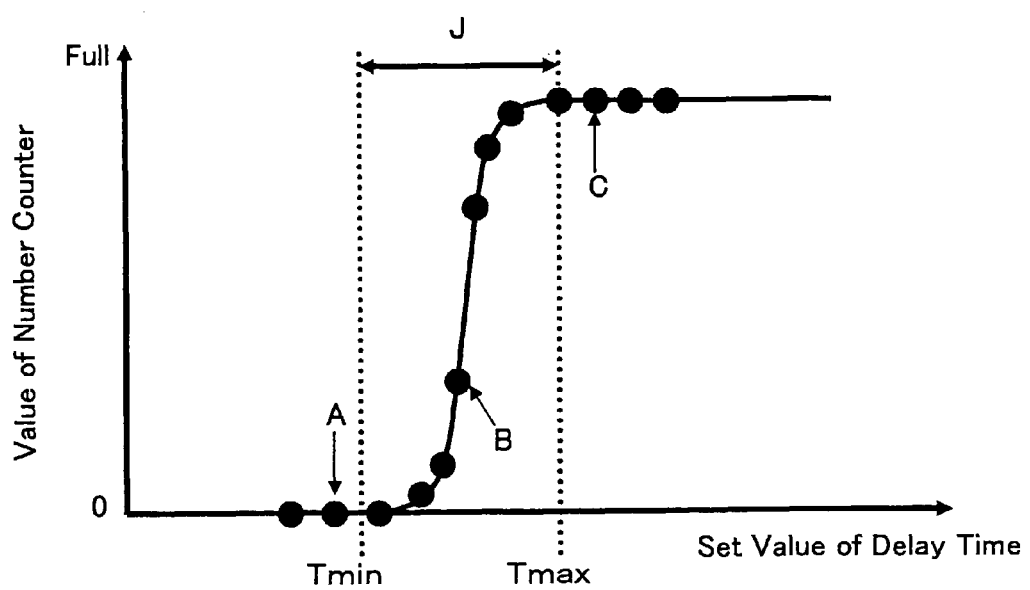
FIG. 21 is a view explaining a measuring method of a jitter using the testing circuit disclosed in Patent Document 1.

Next, as a fourth embodiment of the present invention, an image sensor 40, to which the testing circuit 20 according to the present invention described in the above-described third embodiment is applied, will be described. As shown in FIG. 19, the image sensor 40 according to the present invention is formed by an optical sensor 41 for detecting the light information of one dimensional or two dimensional image data; a memory unit 42 for temporarily memorizing the output data of the light sensor; a transmission unit 43 for converting the output data memorized by the memory unit 42 into serial data and transferring it to the outside at a high speed; a control unit 44 for synchronizing and controlling each operation of the memory unit 42 and the transmission unit 43; and a clock generating circuit 45 for supplying a clock signal for control to the light sensor 41, the memory unit 42, the transmission unit 43, and the control unit 44, respectively. According to the present embodiment, the case such that the light sensor 41, the memory unit 42, the transmission unit 43, the control unit 44, and the clock generating circuit 45 are formed on the same semiconductor substrate to be incorporated in one LSI chip is supposed.

The memory unit 42 is formed by a semiconductor memory device such as a SRAM, and the transmission unit 43 is configured by using a high-speed interface such as a LVDS (Low Voltage Differential Signaling) in order to transfer the serial data at a high speed. Further, a period of program and read of the data to and from the memory unit 42 is set to be later than a data transfer period in the transmission unit 43 because the data is parallel data.

The clock generating circuit 45 is formed by a clock generating circuit 30 configured by a PLL circuit for generating the high-speed clock signal S0 to be supplied to the transmission unit 43; a frequency dividing circuit 46 for dividing the high-speed clock signal S0 from the clock generating circuit 30 and supplying the divided signal to the optical sensor 41, the memory unit 42, and the control unit 44; and the testing circuit 20 according to the present invention, which is described according to the third embodiment. Since the configuration of the clock generating circuit 30 is the same as that of the clock generating circuit 30, which is described according to the third embodiment, the explanation overlapping between them is herein omitted.

According to the configuration of the present embodiment, a timing accuracy of a high-speed clock signal to be used for serial data transfer of the transmission unit 43 is evaluated by the circuit 10 according to the present invention, which is incorporated in the clock generating circuit 45, with a high resolution and a high accuracy, so that an image sensor of a high quality without no disturbance of an image can be screened to be provided.

Fifth Embodiment

Next, as a fifth embodiment of the present invention, a pulse generating circuit for generating a pulse signal for a delay test according to a scan path method of a semiconductor integrated circuit, and a semiconductor integrated circuit, incorporating the pulse generating circuit according to the present invention will be described. The pulse signal is utilized as a launch and capture clock that the launch operation and the capture operation are started in order by the rising edges of two pulses, which are continuously generated. The pulse generating circuit according to the present invention is formed by a control circuit for adjusting a time difference between respective rising edges of the launch operation pulse and the capture operation pulse of the launch and capture clock, and capable of accurately measuring the adjusted time difference by applying the ring oscillation circuit due to the positive feedback according to the present invention, which are described with reference to the first or the second embodiment.

Figure 27:
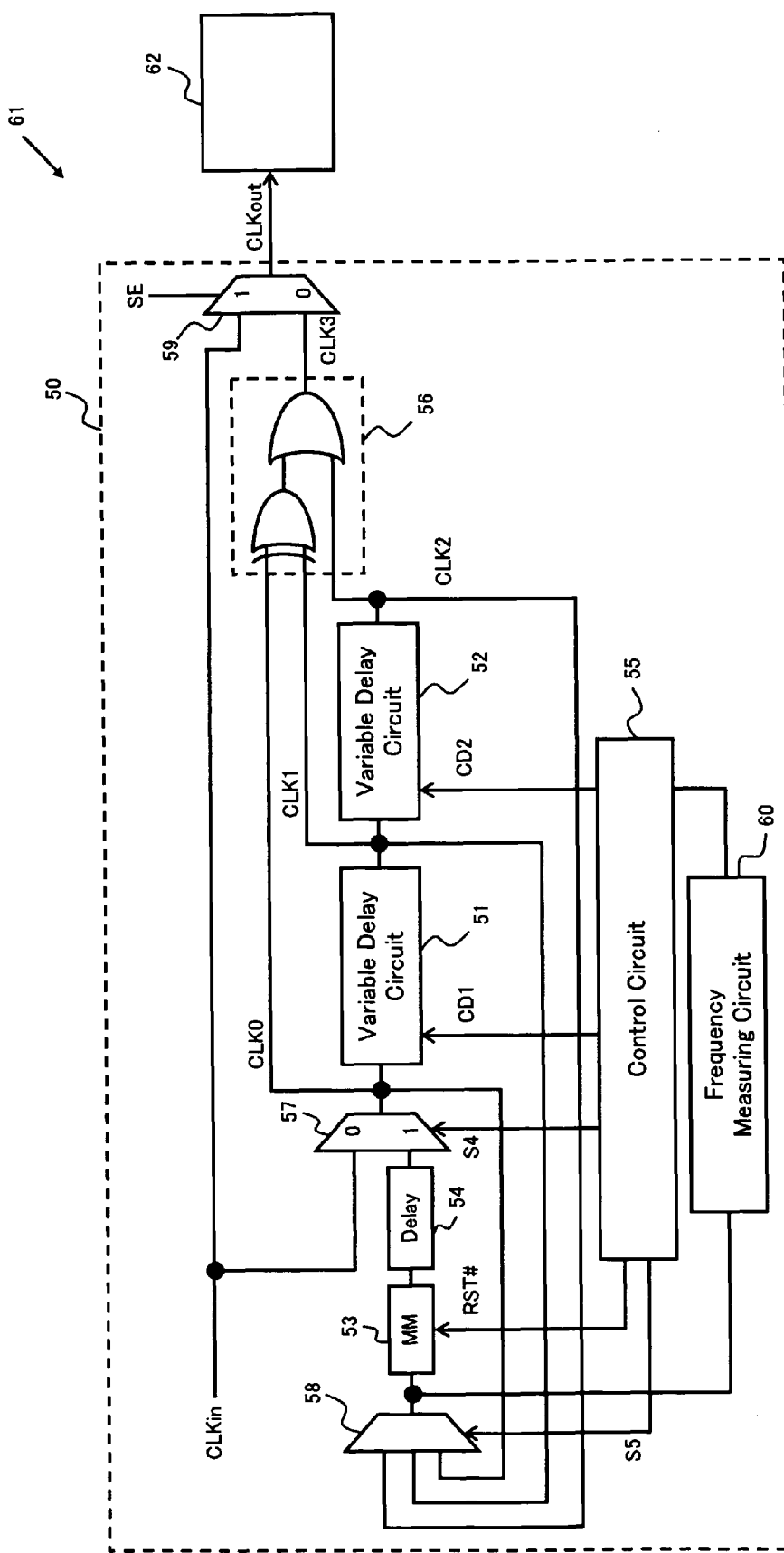
FIG. 27 is a circuit block diagram showing a circuit configuration of an embodiment of a pulse generating circuit according to the present invention and a schematic configuration of an embodiment of a semiconductor integrated circuit according to the present invention.

FIG. 27 is a block diagram showing a circuit configuration of a pulse generating circuit 50 according to the present invention and a schematic configuration of a semiconductor integrated circuit 61 according to the present invention. As shown in FIG. 27, the pulse generating circuit 50 according to the present invention is formed by a delay circuit unit composed of two variable delay circuits 51 and 52; a monostable multivibrator 53; a fixed delay circuit 54; a control circuit 55; a pulse generating circuit 56; three signal selecting circuits 57, 58, and 59; and an oscillation frequency measuring circuit

60. In addition, the semiconductor integrated circuit 61 according to the present invention includes a circuit to be tested 62, which becomes an object of a delay test according to a scan path method by means of the pulse generating circuit 50 according to the present invention, and the semiconductor integrated circuit 61 according to the present invention may include a circuit unit other than the pulse generating circuit 50 and the circuit to be tested 62 (for example, a memory circuit and an asynchronous circuit or the like).

The delay circuit unit is formed by cascade-connecting the two variable delay circuits 51 and 52. Specifically, an output signal CLK0 of the signal selecting circuit 57 for selecting an input clock signal CLKin and the output of the fixed delay circuit 54 is inputted into the variable delay circuit 51 at a front stage, and an output signal CLK1 of the variable delay circuit 51 at a front stage is inputted into the variable delay circuit 52 at a rear stage, from respective variable delay circuits 51 and 52, a first delay signal CLK1 and a second delay signal CLK2 having two different delay times are outputted, respectively, from the output signal CLK0 as an input signal to the delay circuit unit. The delay times of respective variable delay circuits 51 and 52 can be adjusted by a control signals CD1 and CD2 for adjusting a delay time from the control circuit 55, respectively. Respective variable delay circuits 51 and 52 are configured by an inverter line made by cascade-connecting a plurality of inverters, for example, and a part of this inverter line or the all inverters is or are configured so as to be capable of increasing or decreasing a current amount of at least any one of a charge current or a discharge current of each output node by the control signal CD1 or CD2. Depending on an adjusting system of a current amount, the control signals CD1 and CD2 may be an analog signal or may be a digital signal with a plurality of bits. Further, according to the present embodiment, respective delay times of two delay signals CLK1 and CLK2 are configured so as to be capable of being adjusted, respectively, however, from a reason described later, at least a delay time of the later second delay signal CLK2 may be capable of being adjusted independently.

According to the present embodiment, the monostable multivibrator 53 outputs a rising pulse of a pulse width for a predetermined time period, which is specific to a circuit, in response to a rising edge of an input signal. Accordingly, the configuration shown in FIG. 3 or FIG. 8, which is described in the first embodiment, can be used.

The control circuit 55 outputs the control signals CD1 and CD2 for adjusting a delay time to the variable delay circuits 51 and 52 and changes delay times of respective delay signals CLK1 and CLK2 in a delay time adjusting mode, and in order to measure delay times of respective delay signals CLK1 and CLK2, a signal selection of two signal selecting circuits 57 and 58 is controlled by using signal selecting signals S4 and S5 to individually form three positive feedback loops via the monostable multivibrator 53 and the fixed delay circuit 54. Specifically, at the time of measuring a delay time, the signal selection of the signal selecting circuit 57 is switched to the output side of the fixed delay circuit 54 by the signal selecting signal S4. In addition, the formations of three positive feedback loops are switched by the signal selecting signal S5. In other words, it is possible to individually form three positive feedback loops: a first positive feedback loop to be formed in such a manner that the signal selecting circuit 58 selects the second delay signal CLK2 to be outputted from the variable delay circuit 52; a second positive feedback loop to be formed in such a manner that the signal selecting circuit 58 selects the output signal CLK0 of the signal selecting circuit 57; and a third positive feedback loop to be formed in such a manner that the signal selecting circuit 58 selects the first delay signal CLK1 to be outputted from the variable delay circuit 51. Further, the fixed delay circuit 54 is inserted so as to adjust the ring oscillation frequency in the ring oscillation operation using the monostable multivibrator 53 in each positive feedback loop.

In addition, forming each positive feedback loop in a delay time adjusting mode, the control circuit 55 outputs the signal RST# to activate the monostable multivibrator 53, allows the monostable multivibrator 53 to output a pulse of the first time, and after that, allows the monostable multivibrator 53 to continue the ring oscillation due to a positive feedback. Further, since the ring oscillation operation using the monostable multivibrator 53 in each positive feedback loop has been described with reference to the first embodiment, the explanation overlapping between them is herein omitted. Further, activating the monostable multivibrator 53, the control circuit 55 activates an oscillation frequency measuring circuit 60 to measure the ring oscillation frequency of the positive feedback loop, memorizes its measuring result, and on the basis of this measuring result, calculates the delay times of respective delay signals CLK1 and CLK2.

The pulse generating circuit 56 generates the pulse signal CLK3 from the output signal CLK0 of the signal selecting circuit 57, the first delay signal CLK1, and the second delay signal CLK2 so that the pulse signal CLK3 has two times of rising edges within one period of the output signal CLK0, and the time difference between the two times of the rising edges becomes equal to the delay time of the second delay signal CLK2 from the input clock signal. Here, the signal selecting circuit 57 selects the input clock signal CLKin in an actual operational mode on a delay test according to a scan path method and outputs it as the output signal CLK0, so that the output signal CLK0 is substantially the same as the input clock signal CLKin.

In response to an external control signal SE, the signal selecting circuit 59 selects the input clock signal CLKin upon the shift operation in the actual operational mode, and selects a pulse signal CLK3 to be outputted from the pulse generating circuit 56 upon the launch and capture operations in the actual operational mode, and outputs the selected signal as an output clock signal CLKout. This output clock signal CLKout is used as a clock pulse of the circuit to be tested 62 upon the actual operational mode.

The pulse generating circuit 50 according to the present invention has two operational modes consisting of an actual operational mode and a delay time adjusting mode. Next, each operation of the actual operational mode and the delay time adjusting mode of the pulse generating circuit 50 will be described. At first, the operation of the actual operational mode will be described.

Figure 28:
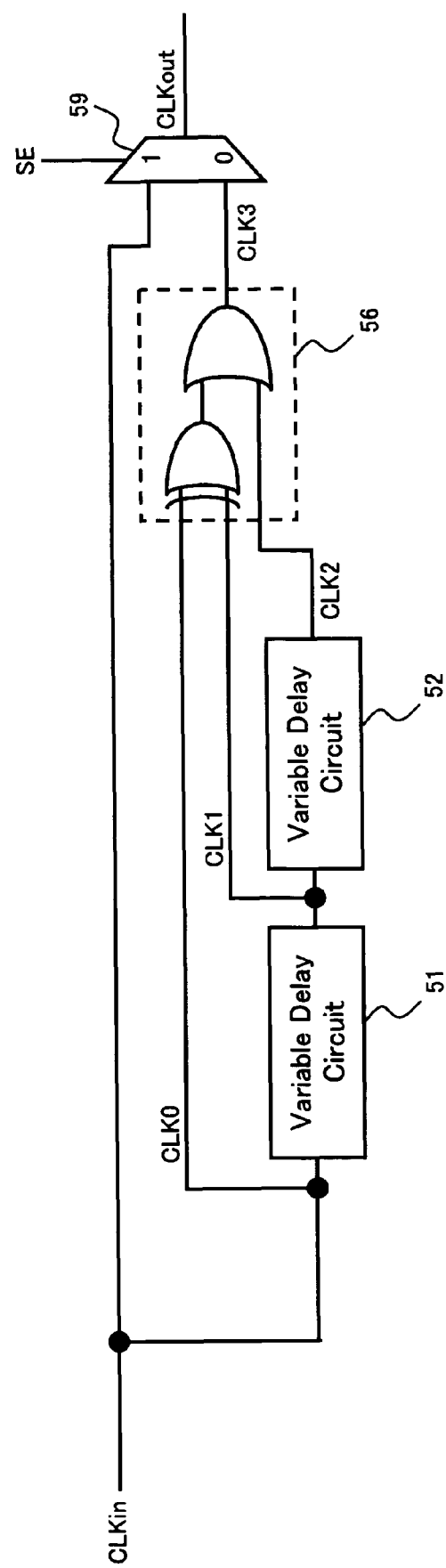
FIG. 28 is a circuit block diagram extracting and showing an actual operation circuit part operated in an actual operational mode in the pulse generating circuit shown in FIG. 27.
Figure 29:
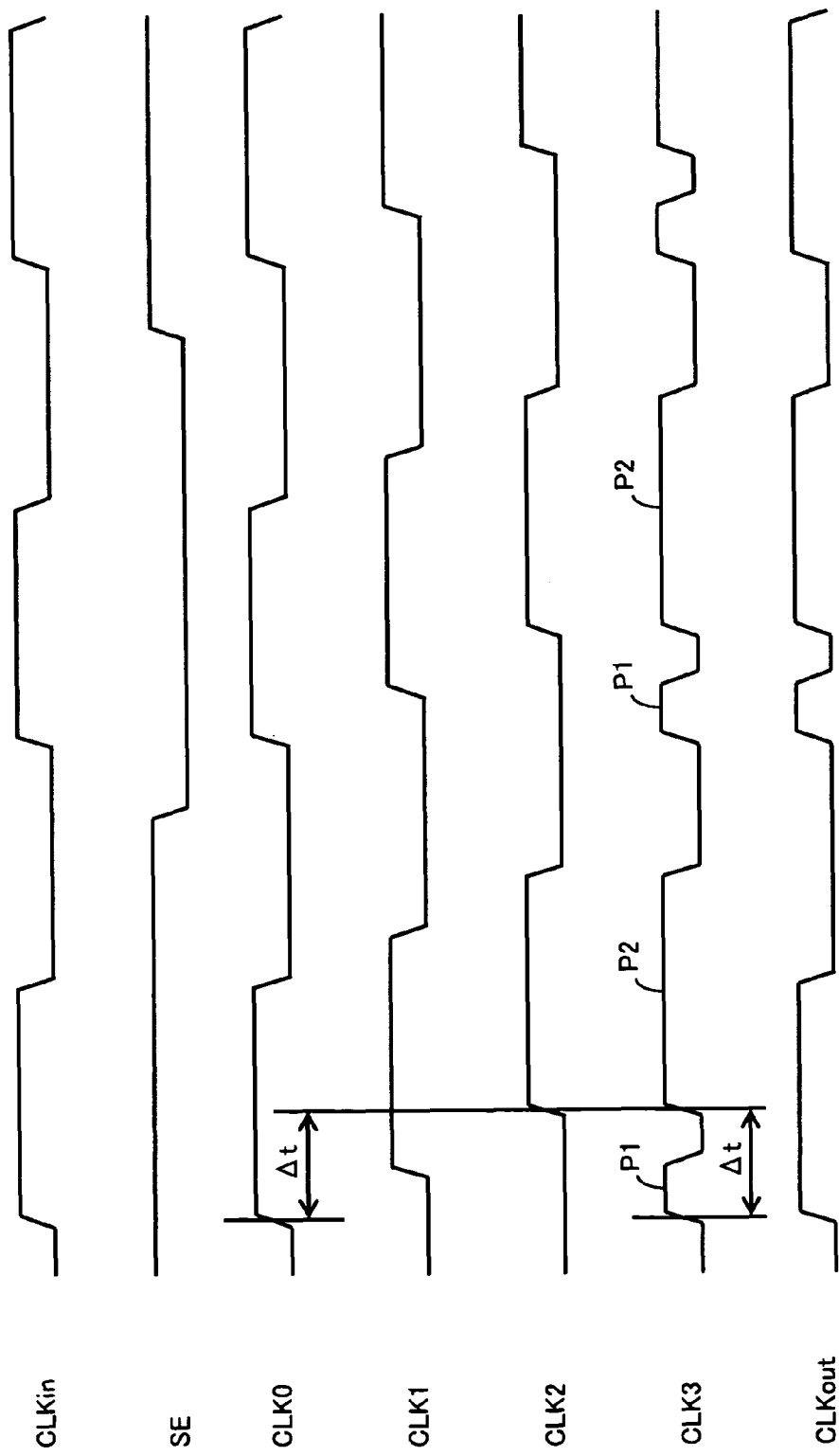
FIG. 29 is a timing waveform view schematically showing an inner signal waveform in the actual operation circuit part of the pulse generating circuit shown in FIG. 28.

FIG. 28 shows an actual operation circuit part, which is operated in an actual operational mode in the pulse generating circuit 50 shown in FIG. 27, by extracting it. In addition, FIG. 29 is a timing waveform view schematically showing an inner signal waveform in the actual operation circuit part shown in FIG. 28. In the actual operational mode, the two variable delay circuits 51 and 52, the pulse generating circuit 56, and the signal selecting circuit 59 are operated. Further, since the signal selecting circuit 57 is fixed with an input clock signal CLKin selected, the signal selecting circuit 57 is not included in FIG. 28.

In the actual operational mode, the signal selecting circuit 59 selects the input clock signal CLKin upon shift operation (when the external control signal SE is at a high level) and outputs it as the output clock signal CLKout. This output clock signal CLKout upon the shift operation is used as a shift clock of a scan path in the circuit to be tested 62. Upon the launch and capture operations (when the external control signal SE is at a low level), the signal selecting circuit 59 outputs the pulse signal CLK3 as the output clock signal CLKout. The pulse signal CLK3 continuously generates a launch operation pulse P1, which rises at a rising edge of the clock signal CLK0 and falls at a rising edge of the first delay signal CLK1, and a capture operation pulse P2, which rises at a rising edge of the second delay signal CLK2 and falls at a falling edge of the second delay signal CLK2 within one period of the input clock signal CLKin. Specifically, the pulse signal CLK3 is generated in the pulse generating circuit 56 as a result of an exclusive or (ExOR) between the clock CLK0 and the first delay signal CLK1 and a logical addition (OR) between the resultant clock signal and the second delay signal CLK2. As a result, with reference to the rising edge of the input clock signal CLKin, the rising edge and the falling edge of the launch operation pulse P1, and the rising edge of the capture operation pulse P2 are continuously generated by turns. A time difference $\Delta t$ between the rising edge of the launch operation pulse P1 and the rising edge of the capture operation pulse P2 is equal to a delay time from the rising edge of the clock signal CLK0 up to the rising edge of the second delay signal CLK2, namely, a total delay time of the rising edges of the two variable delay circuit 51 and 52. The output clock signal CLKout upon the launch and capture operations is used as a launch and capture clock of the scan path in the circuit to be tested 62.

Here, a time difference $\Delta t$ between the rising edge of the launch operation pulse P1 and the rising edge of the capture operation pulse P2, that is, a total delay time of the two variable delay circuits 51 and 52 needs management in the delay test. Furthermore, the rising edge delay time of the variable delay circuit 51 of the front stage is a delay time from the rising edge of the clock signal CLK0 to the rising edge of the first delay signal CLK1 to define a pulse width (a high level time period) of the launch operation pulse P1. In addition, the rising edge delay time of the variable delay circuit 52 of the rear stage is a delay time from the rising edge of the first delay signal CLK1 to the rising edge of the second delay signal CLK2 to define a pulse interval (a low level time period) between the launch operation pulse P1 and the capture operation pulse P2.

Figure 30:
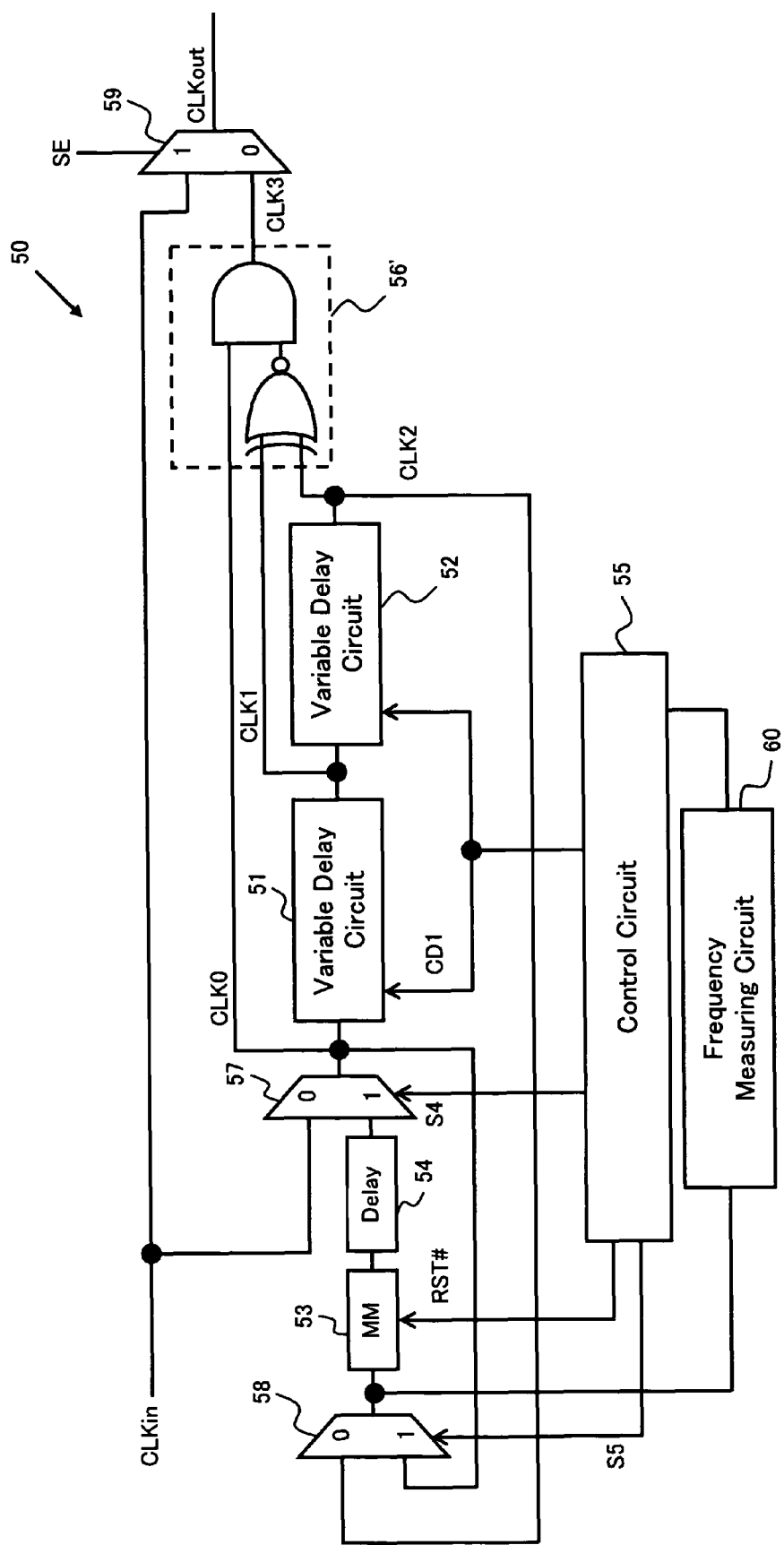
FIG. 30 is a circuit block diagram showing a circuit configuration of other embodiment of a pulse generating circuit according to the present invention.

In the delay test according to the scan path method, the pulse width (the high level time period) of the pulse signal CLK3 and the pulse interval (the low level period) themselves have no influence on measurement, and only the time difference $\Delta t$ between the rising edge of the launch operation pulse P1 and the rising edge of the capture operation pulse P2 has an influence on measurement. As a result, the present embodiment is configured so as to be capable of adjusting delay times of the two variable delay circuits 51 and 52 independently and respectively, however, as shown in FIG. 30, the two variable delay circuits 51 and 52 may be adjusted by one control signal CD1 for adjusting the delay time at the same time. Further, the pulse width (the high level time period) of the capture operation pulse P2 is also not necessarily needed to be the same as the pulse width (the high level time period) of the second delay signal CLK2, and the capture operation pulse P2 may be generated so as to rise at the rising edge of the second delay signal and fall at the falling edge of the clock signal CLK0 or the delay signal CLK1. In this case, the circuit configuration of the pulse generating circuit 56 is not that shown in FIG. 27, but, for example, as shown in FIG. 30, the circuit configuration of the pulse generating circuit 56 may be that of a pulse generating circuit 56' to be generated as a result of an exclusive not or (ExNOR) between the first delay signal CLK1 and the second delay signal CLK2 and a logical multiplication (AND) between the resultant signal and the clock signal CLK0. In another configuration of the pulse generating circuit 50 shown in FIG. 30, the third positive feedback loop is not used for adjustment of the time difference $\Delta t$ as described later, so that the signal selecting circuit 58 is illustrated as a signal selecting circuit of two input for selecting any one of the output signal CLK0 of the signal selecting circuit 57 and the second delay signal CLK2.

The delay time is not clear when the delay times of the two variable delay circuits 51 and 52 have not been adjusted yet, so that the above-described time difference $\Delta t$ of the pulse signal CLK3 to be generated remains in a state of unclearness. In order to solve such an unclear state, before using the output clock signal CLKout in an actual operational mode, the delay times of the two variable delay circuits 51 and 52 are adjusted by the delay time adjustment mode in advance so that the time difference $\Delta t$ of the pulse signal CLK3 takes a predetermined value.

Figure 31:
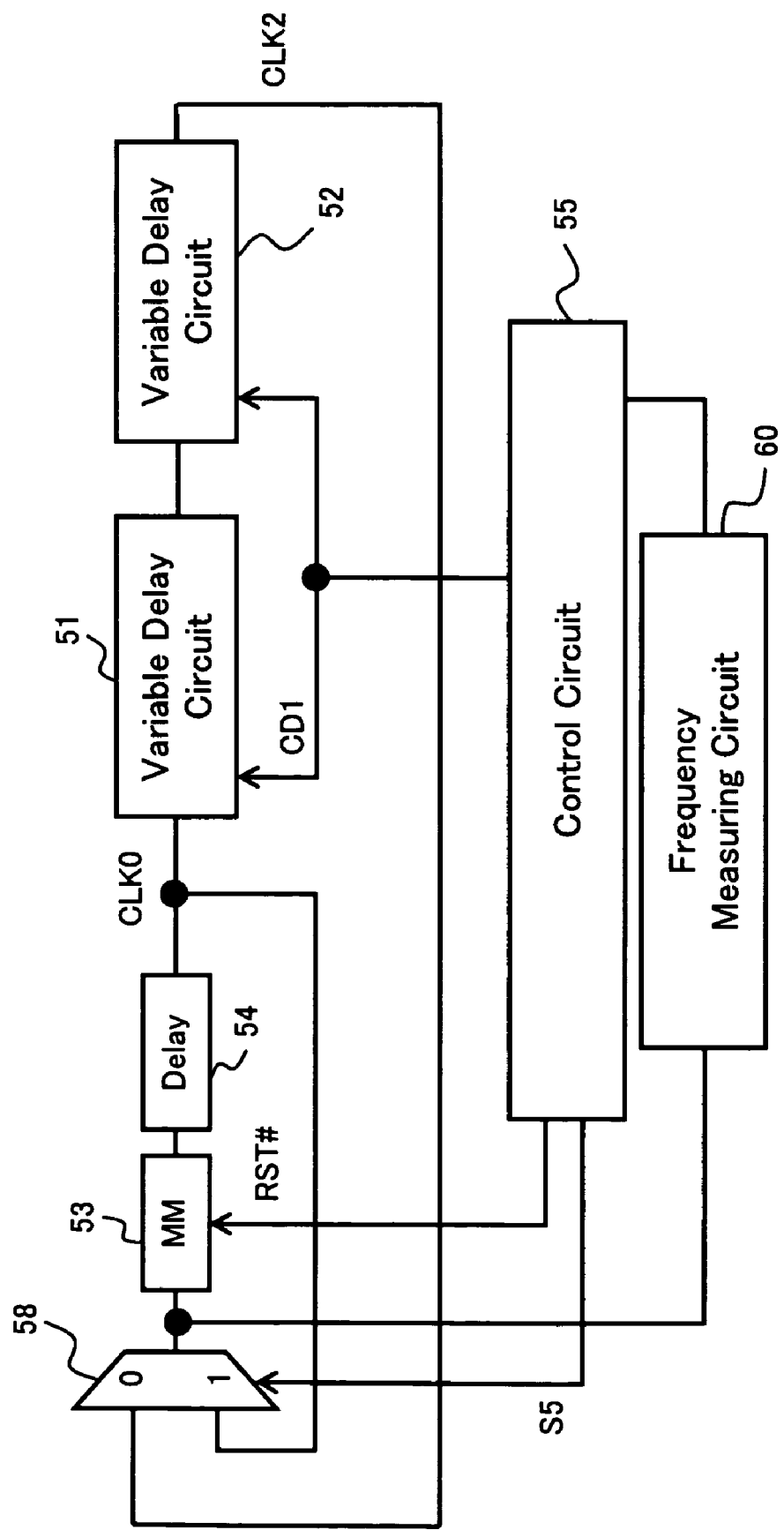
FIG. 31 is a circuit block diagram extracting and showing an adjusting operation circuit part operated in a delay time adjusting mode in the pulse generating circuit of FIG. 27.
Figure 32:
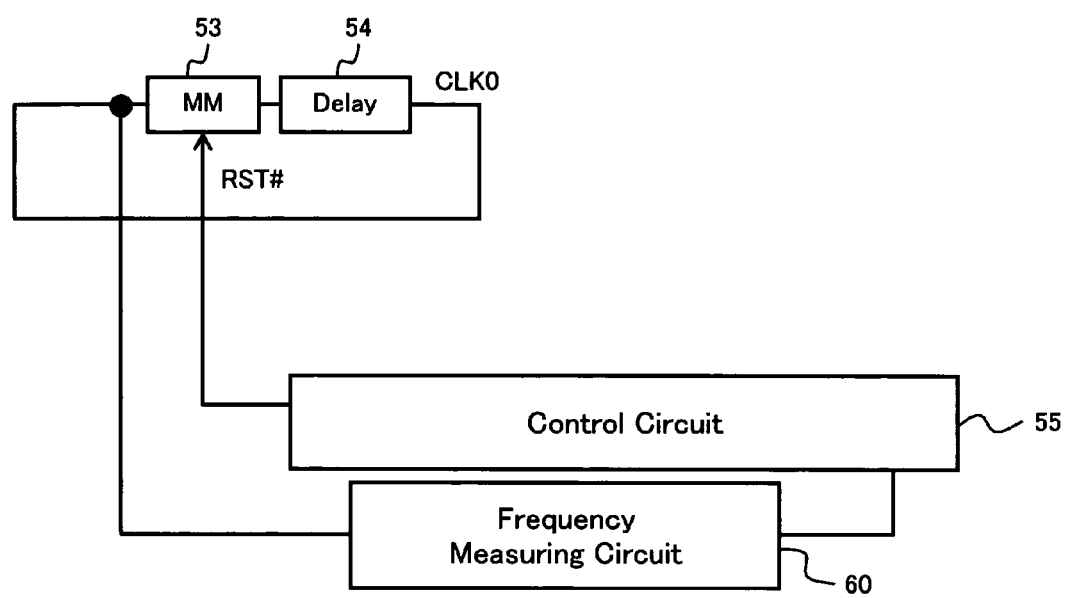
FIG. 32 is a circuit block diagram showing a second-adjusting operation circuit part operated when a second positive feedback loop is formed without including two variable delay circuits in the adjusting operation circuit part shown in FIG. 31.
Figure 33:
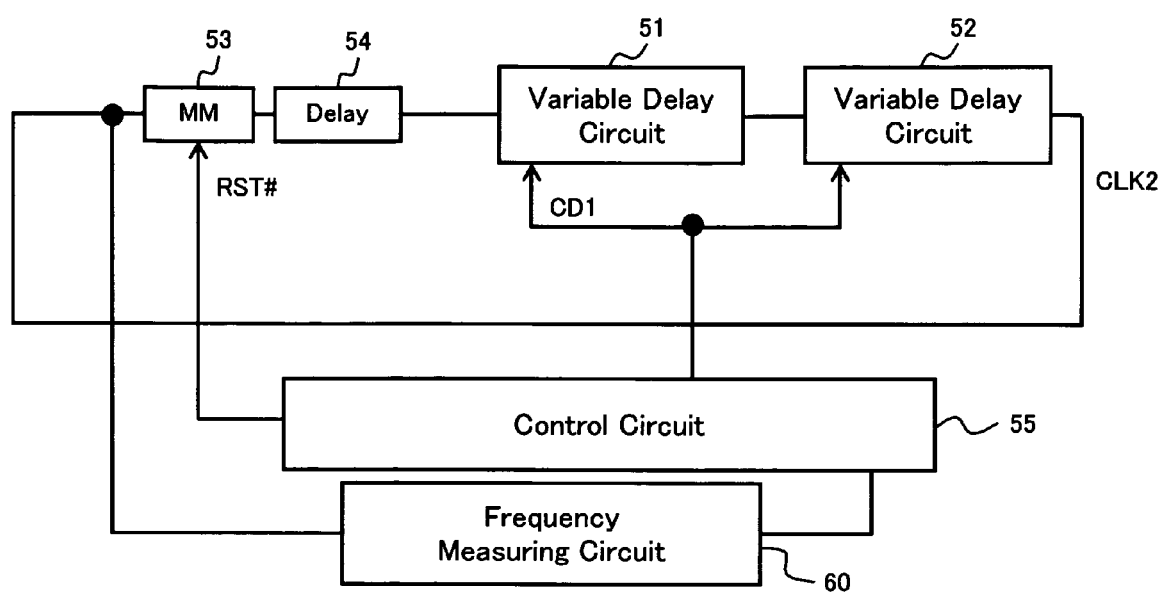
FIG. 33 is a circuit block diagram extracting and showing a first adjusting operation circuit part operated when a first positive feedback loop is formed including two variable delay circuits in the adjusting operation circuit part shown in FIG. 31.

The delay time adjustment mode is a mode for adjusting the delay times of the two variable delay circuits 51 and 52. According to the present embodiment, by using the first positive feedback loop and the second positive feedback loop among the above-described three positive feedback loops, the adjustment of the time difference $\Delta t$ is carried out. FIG. 31 shows an adjustment operation circuit part, which is operated in the delay time adjustment mode in the pulse generating circuit 50 shown in FIG. 27, by extracting it. In addition, FIG. 32 shows a second adjustment operation circuit part, which is operated when generating the second positive feedback loop not including the two variable delay circuits 51 and 52 in the adjustment operation circuit part of FIG. 31. In addition, FIG. 33 shows a first adjustment operation circuit part, which is operated when generating the first positive feedback loop including the two variable delay circuits 51 and 52 in the adjustment operation circuit part of FIG. 31 by extracting it. Further, since the signal selecting circuit 57 is fixed to the state of selecting the output side of the fixed delay circuit 54, the signal selecting circuit 57 is not included in FIGS. 31 to 33. In addition, since the signal selecting circuit 58 is fixed to the state of selecting a corresponding feedback signal when generating each feedback loop, the signal selecting circuit 58 is not included in FIGS. 32 and 33.

Figure 34:
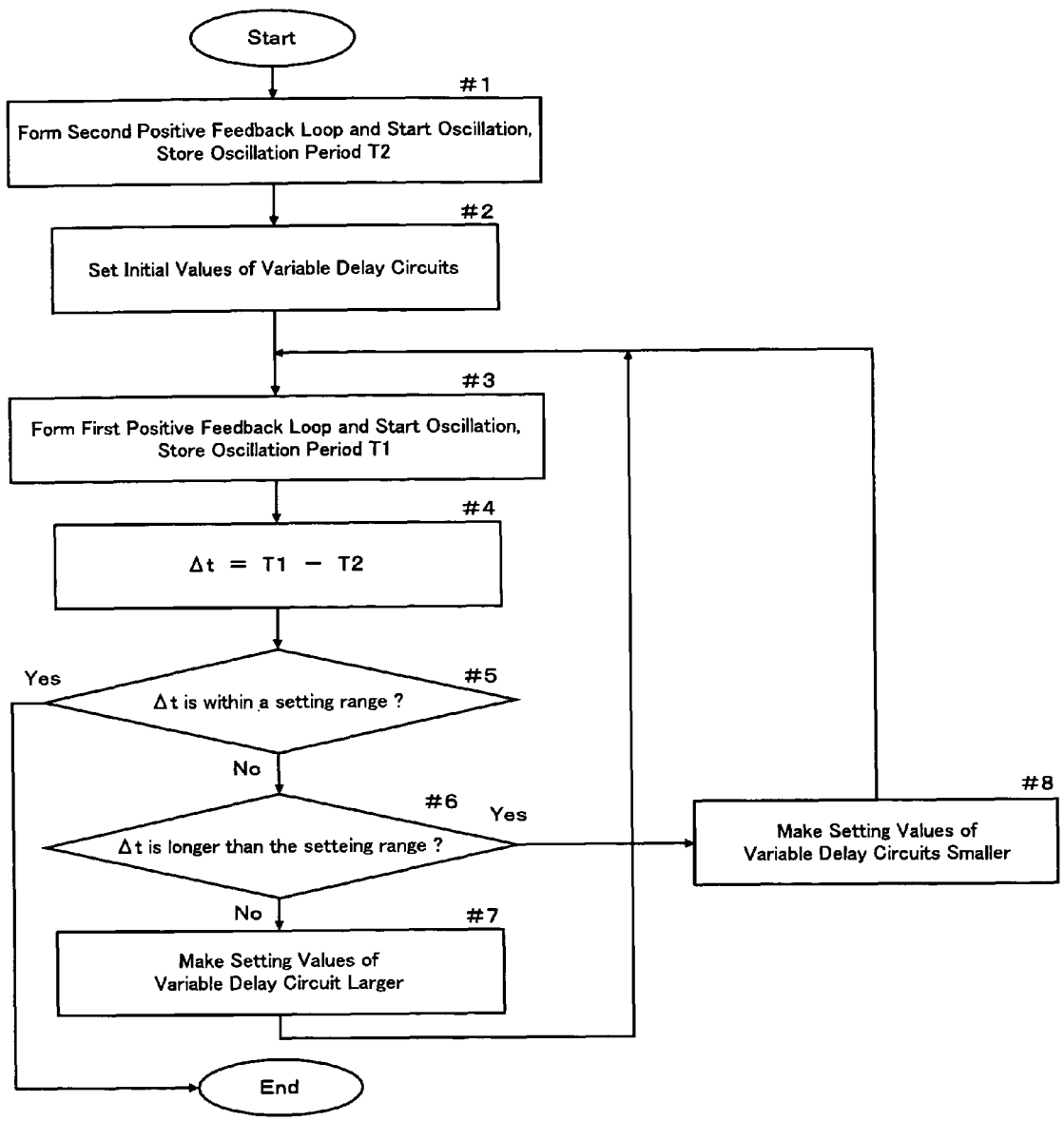
FIG. 34 is a flow chart showing an algorism for adjusting a rising edge interval of launch and capture clock in a delay time adjusting mode of an embodiment of a pulse generating circuit according to the present invention.

FIG. 34 shows an algorism for adjusting a time difference $\Delta t$ in a delay time adjusting mode. As an adjustment operational procedure, at first, forming a second positive feedback loop not including the two variable delay circuits 51 and 52 shown in FIG. 32, starting a ring oscillation operation in the above-described way, and measuring this ring oscillation frequency by using the oscillation frequency measuring circuit 60, the control circuit 55 calculates an oscillation period T2, which is an inverse number thereof, to store it in a register within the control circuit 55 (Step #1). Next, outputting the control signals CD1 and CD2 for adjusting a delay time to the two variable delay circuits 51 and 52, the control circuit 55 sets an initial value of each delay time (Step #2). Continuously, forming a first positive feedback loop including the two variable delay circuits 51 and 52 shown in FIG. 33, starting a ring oscillation operation in the above-described way, and measuring this ring oscillation frequency by using the oscillation frequency measuring circuit 60, the control circuit 55 calculates an oscillation period T1, which is an inverse number thereof, to store it in a register within the control circuit 55 (Step #3). Next, the control circuit 55 calculates a delay time difference (T1−T2=$\Delta t$) by an arithmetic circuit within the control circuit 55 (Step #4). This delay time difference $\Delta t$ becomes a time difference Δt between the rising edge of the launch operation pulse P1 and the rising edge of the capture operation pulse P2.

The control circuit 55 may determine if the calculated time difference Δt is located within a predetermined setting range or not (Step #5). If the calculated time difference Δt is located within a predetermined setting range (YES branch in Step #5), the control circuit 55 may end the delay time adjustment mode. If the calculated time difference Δt is not located within a predetermined setting range (NO branch in Step #5), the control circuit 55 may determine if the time difference Δt is longer than the predetermined setting range or not (Step #6). If the time difference Δt is shorter (NO branch in Step #6), setting values of the delay times of the two variable delay circuits 51 and 52 are made larger by the control signals CD1 and CD2 (Step #7), and on the contrary, if the time difference Δt is longer (YES branch in Step #6), setting values of the delay times of the two variable delay circuits 51 and 52 are made shorter (Step #8). Then, returning to Step #3, forming a first positive feedback loop again, starting the ring oscillation operation in the above-described way, and measuring its ring oscillation frequency again by using the oscillation frequency measuring circuit 60, the control circuit 55 may calculate the oscillation period T1, which is an inverse number thereof, again to store it in the register of the control circuit 55. The operation after Step #3 is repeated until the calculated time difference Δt is located in a predetermined setting range at the determination of Step #5, and then the delay time adjustment mode is ended. Here, the control circuit 55 may store the time difference Δt, which is located in a predetermined setting range, in the register of the control circuit 55. In the actual operational mode, by reading and using this time difference Δt, the pulse generating circuit 50 according to the present invention may function as a circuit for generating a launch and capture clock of the rising edge interval of a predetermined time difference Δt, so that a desired delay test becomes possible.

Here, characteristic of the pulse generating circuit 50 according to the present invention will be organized. The first characteristic is that the monostable multivibrator 53 is used for a positive feedback loop to be used in the delay time adjustment mode. Thereby, even if the rising edge propagation characteristics of the variable delay circuits 51 and 52 are different from the falling edge propagation characteristics thereof, this does not become an error of measurement in the pulse generating circuit 50. The monostable multivibrator 53 outputs a rising pulse of a predetermined pulse width in response to a rising edge of input because, in the pulse signal CLK3 generated by the pulse generating circuit 50, the rising edge interval is only important in the delay test. Therefore, the rising edge propagation characteristics of the variable delay circuits 51 and 52 can be accurately measured.

The second characteristic is that the oscillation period T1 of the first positive feedback loop including the two variable delay circuits 51 and 52 does not necessarily correspond to the total delay times of the two variable delay circuits 51 and 52 one-on-one. This is because a ring oscillation frequency is lowered by inserting the fixed delay circuit 54 for adjustment of the ring oscillation frequency in each ring oscillation circuit to be configured by a positive feedback loop. Although the conventional ring oscillation circuit due to the negative feedback loop has a problem such that an accurate measurement is not realized if an extra delay is found in the ring oscillation circuit itself, due to the third characteristic to be shown next that the rising edge interval of the launch and capture clock is defined by relatively using the clock edge of the delay circuit unit, the pulse generating circuit 50 according to the present invention has a circuit configuration such that a measurement is not influenced by a delay time like an absolute value of the entire ring oscillation circuit.

Figure 35:
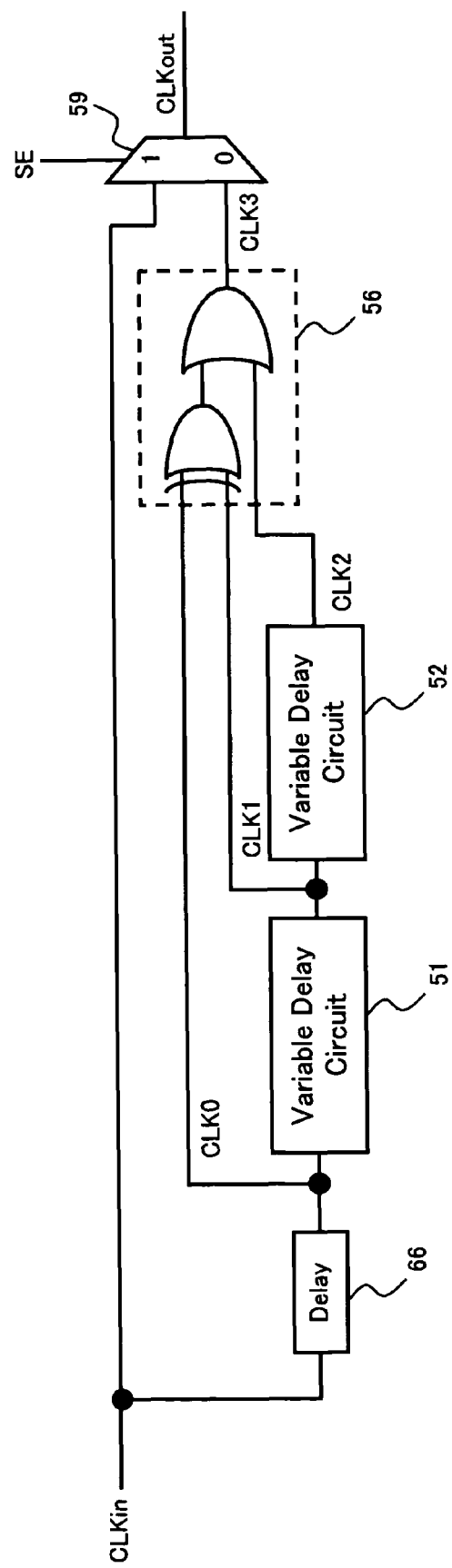
FIG. 35 is a circuit block diagram showing a circuit configuration, in which a fixed delay circuit is added to an input side of a variable delay circuit of a front stage of the actual operation circuit part shown in FIG. 28.
Figure 36:
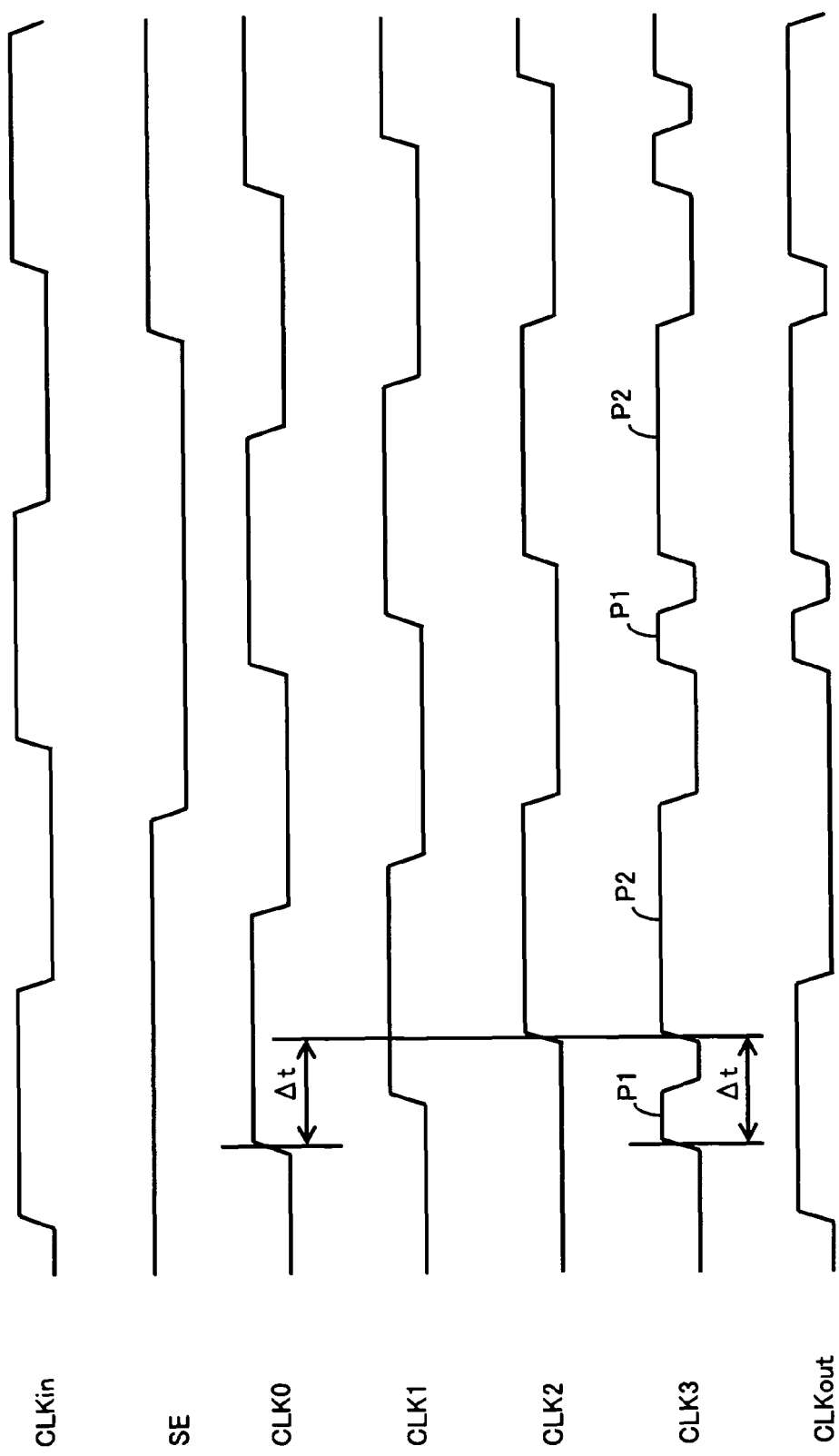
FIG. 36 is a timing waveform view schematically showing the inner signal waveform in the actual operation circuit part shown in FIG. 35.

The third characteristic is that the rising edge interval of the launch and capture clock is defined by relatively using the clock edge of the delay circuit unit. In the pulse generating circuit 50 according to the present invention, the circuit configuration to define timing (a rising edge interval of a launch and capture clock) necessary for the delay test by using only the rising edge of the input clock signal CLKin and the rising edge of the second delay signal CLK2 obtained by delaying the rising edge of the input clock signal CLKin by means of the variable delay circuits 51 and 52 is employed. As a result, even if a fixed delay circuit or the like having a fixed delay time is inserted in a ring oscillation circuit, which is configured by the first positive feedback loop including the two variable delay circuits 51 and 52, the rising edge interval of the launch and capture clock can maintain a setting value although the launch and capture clock is entirely shifted. With respect to this advantage, the explanation is given with reference to FIG. 35 and FIG. 36. FIG. 35 is a block diagram showing the circuit configuration, in which the fixed delay circuit 66 is added to the input side of the variable delay circuit 51 of a front stage of the actual operation circuit part shown in FIG. 28, and FIG. 36 is a timing waveform view schematically showing the inner signal waveform in the circuit configuration shown in FIG. 35. As shown in FIG. 36, the timing of the output clock signal CLKout is entirely shifted right (later) due to the delay time of the fixed delay circuit 66, however, it is known that the time difference Δt (the edge interval) between the rising edge of the launch operation pulse P1 and the rising edge of the capture operation pulse P2 is retained as it is. In addition, due to this addition of the fixed delay circuit 66, the ring oscillation frequency is lowered, and there is no necessary that the entireness of the actual operation circuit part is designed so as to be capable of realizing a high-speed operation.

The fourth characteristic is having two ring oscillation circuits of different oscillation frequencies due to at least two positive feedback loops (according to the present embodiment, the first and second positive feedback loops). These two ring oscillation circuits are configured so that the different parts thereof become the variable delay circuits 51 and 52 to be used for adjustment of the time difference Δt between the rising edge of the launch operation pulse P1 and the rising edge of the capture operation pulse P2. Thereby, it is possible to calculate the total delay time of these two variable delay circuits 51 and 52 from the difference between the oscillation periods T1 and T2 of two ring oscillation circuits. By employing this method, it is possible to accurately obtain a propagation time between specific two points (according to the present embodiment, from input terminals to output terminals of the variable delay circuits 51 and 52) in the entire circuit.

Sixth Embodiment

Next, as a sixth embodiment of the present invention, another embodiment of the pulse generating circuit 50 according to the fifth embodiment of the present invention will be described.

Figure 37:
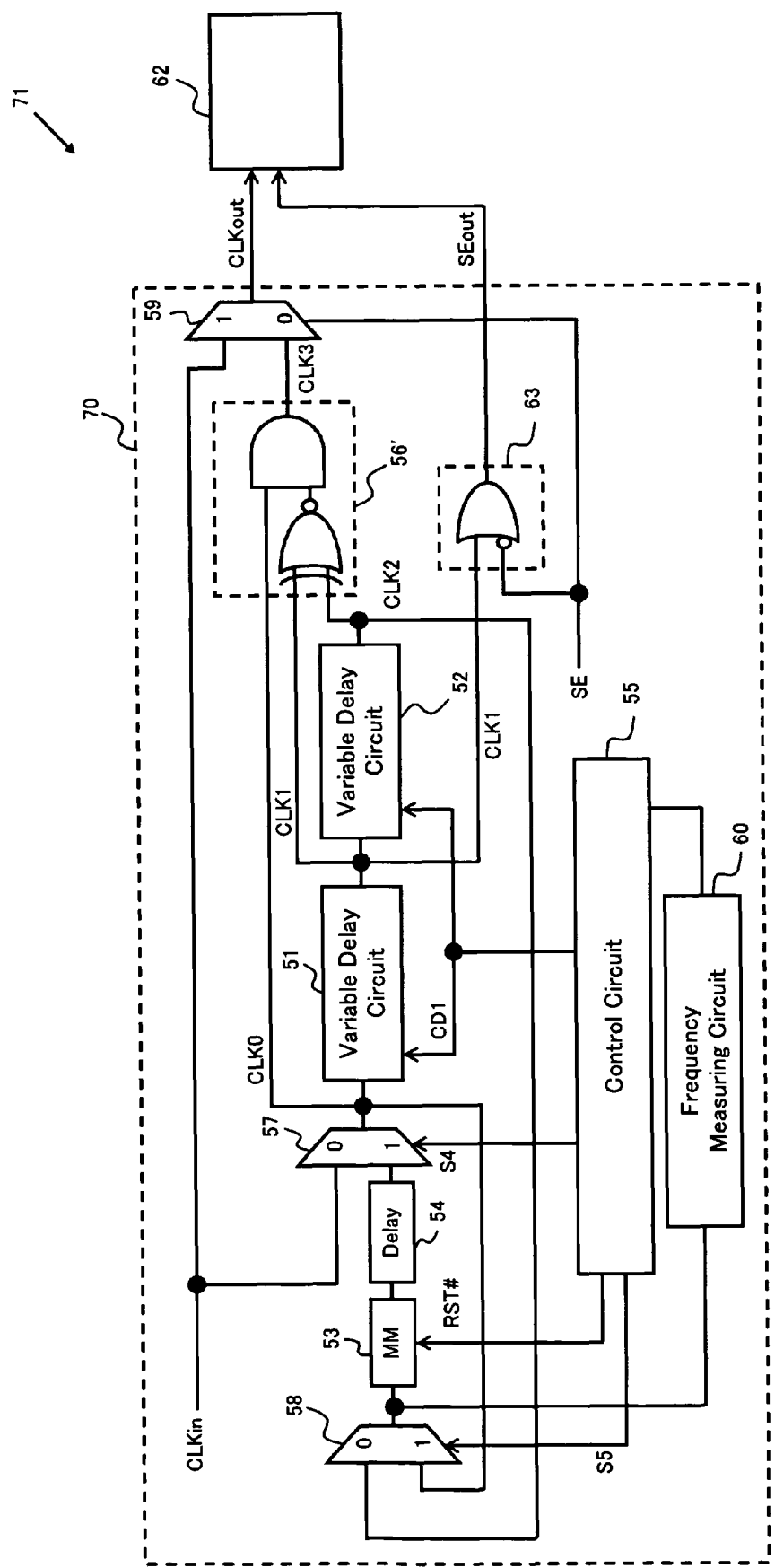
FIG. 37 is a circuit block diagram showing a circuit configuration of other embodiment of a pulse generating circuit according to the present invention and a schematic configuration of other embodiment of a semiconductor integrated circuit according to the present invention.

FIG. 37 is a block diagram showing a circuit configuration of a pulse generating circuit 70 according to the present invention, and showing a schematic configuration of a semiconductor integrated circuit 71 according to the present invention. As shown in FIG. 37, the pulse generating circuit 70 according to the present invention is formed by a delay circuit unit composed of the two variable delay circuits 51 and 52; the monostable multivibrator 53; the fixed delay circuit 54; the control circuit 55; the pulse generating circuit 56'; three signal selecting circuits 57, 58, and 59; the oscillation frequency measuring circuit 60; and a second pulse generating circuit 63. In addition, the semiconductor integrated circuit 71 is configured including the circuit to be tested 62, which is a target of the delay test according to the scan path method by means of the pulse generating circuit 70 according to the present invention, and the semiconductor integrated circuit 71 may include a circuit unit other than the pulse generating circuit 70 and the circuit to be tested 62 (for example, a memory circuit and an asynchronous circuit or the like).

The pulse generating circuit 70 according to the sixth embodiment of the present embodiment is different from the pulse generating circuit 50 only in that the second pulse generating circuit 63 is added in the sixth embodiment, and other circuit configurations are the same as the fifth embodiment. Therefore, the explanation overlapping between them is herein omitted. However, in the pulse generating circuit 70, as same as the circuit configuration of FIG. 30, the signal selecting circuit 58 is illustrated as a signal selecting circuit having two inputs for selecting any one of the output signal CLK0 of the signal selecting circuit 57 and the second delay signal CLK2.

The second pulse generating circuit 63 generates a second pulse signal SEout to be generated in synchronization with a time period during which the signal selecting circuit 59 is selecting the pulse signal CLK3 in the launch and capture operations in the actual operational mode. Specifically, the second pulse generating circuit 63 outputs a second pulse signal SEout as a result of a logical addition (OR) between the first delay signal CLK1 and a negative logic (a reverse signal) of the external control signal SE. Accordingly, according to the sixth embodiment, the pulse generating circuit 70 according to the present invention outputs the output clock signal CLKout and the second pulse signal SEout.

Since the second pulse generating circuit 63 is a circuit, which is used in the actual operational mode, in the delay time adjustment mode, the operation of the pulse generating circuit 70 according to the present invention is exactly the same as the fifth embodiment. The operation in the actual operational mode of the pulse generating circuit 70 according to the present invention will be described.

Figure 38:
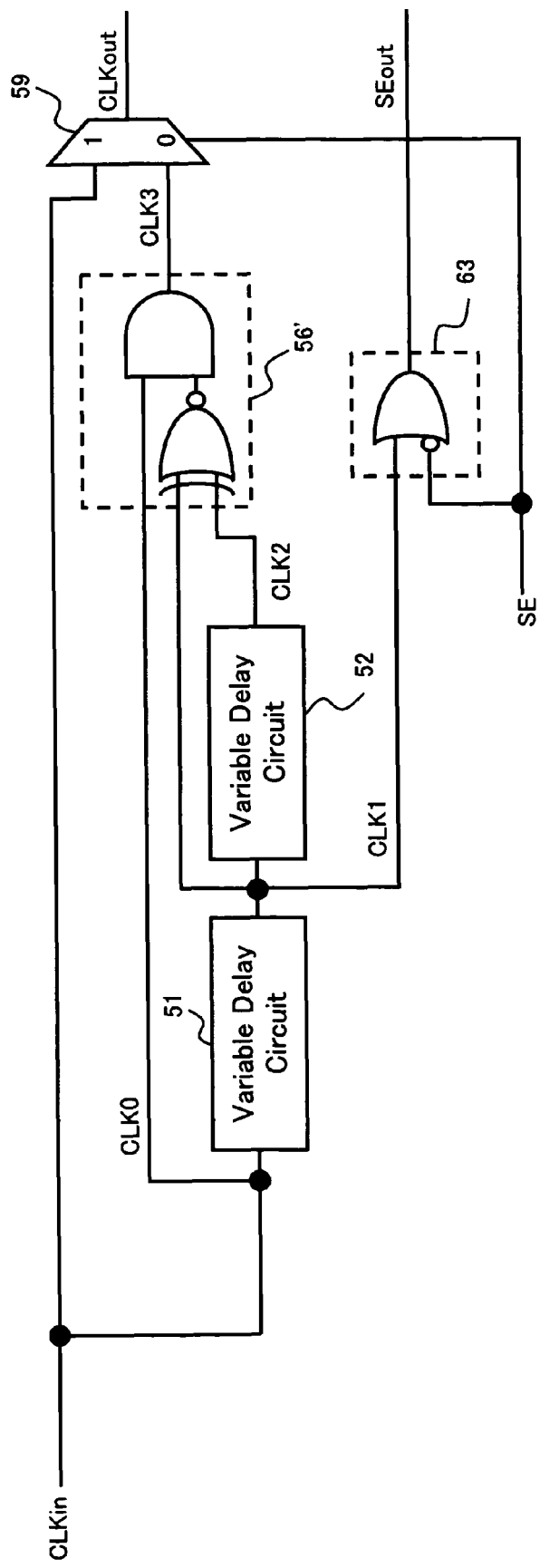
FIG. 38 is a circuit block diagram extracting and showing an actual operation circuit part operated in an actual operational mode in the pulse generating circuit shown in FIG. 37.
Figure 39:
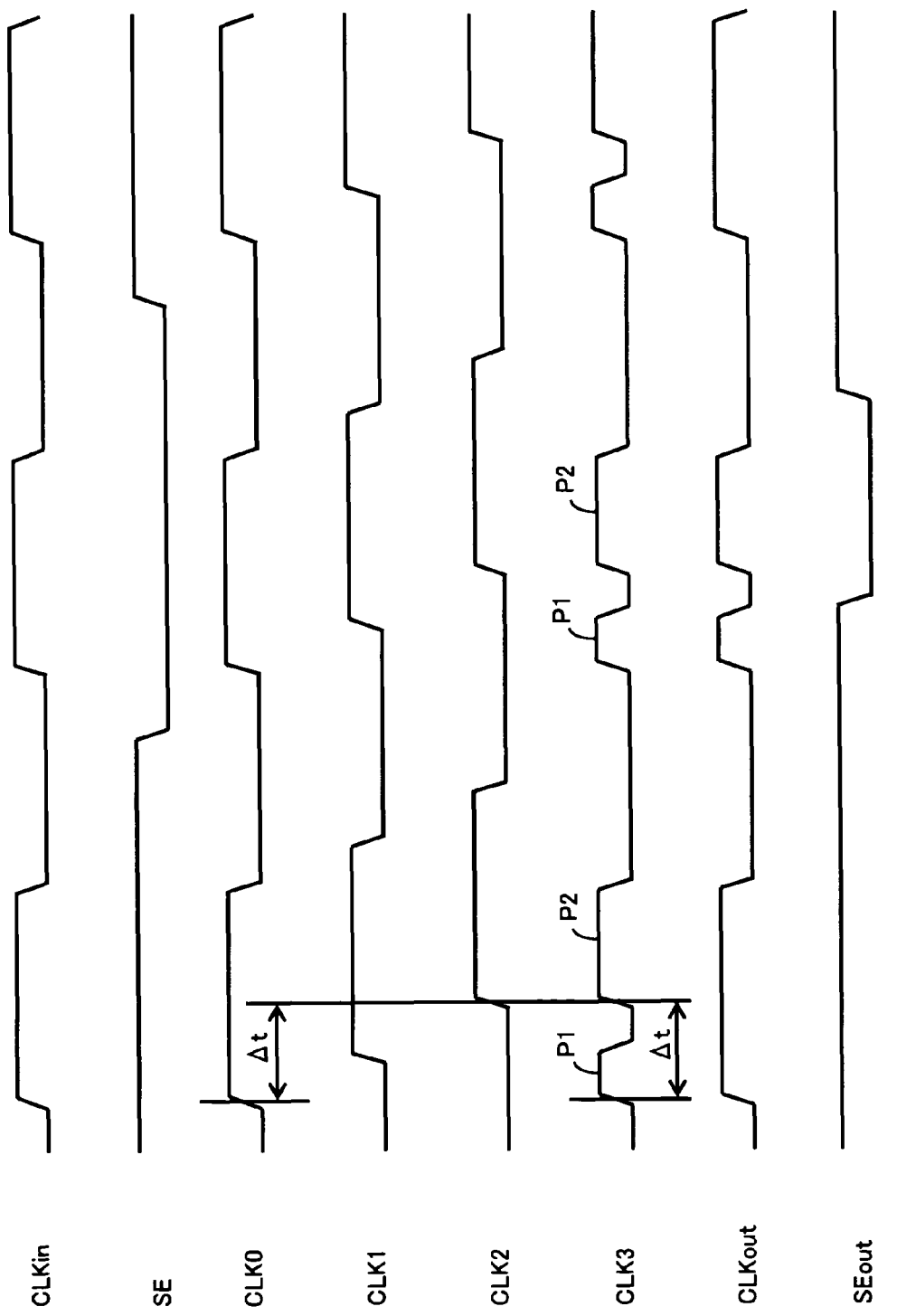
FIG. 39 is a timing waveform view schematically showing an inner signal waveform in the actual operation circuit part of the pulse generating circuit shown in FIG. 38.

FIG. 38 shows an actual operation circuit part, which is operated in an actual operational mode in the pulse generating circuit 70 shown in FIG. 37 by extracting it. In addition, FIG. 39 is a timing waveform view schematically showing an inner signal waveform in the actual operation circuit part shown in FIG. 38. Under the actual operational mode, the two variable delay circuits 51 and 52, the pulse generating circuit 56, the signal selecting circuit 59, and the second pulse generating circuit 63 are operated. Further, since the signal selecting circuit 57 is fixed to the state of selecting the input clock signal CLKin, the signal selecting circuit 57 is not included in FIG. 38.

From this actual operation circuit part, two signals, namely, the output clock signal CLKout and the second pulse signal SEout are outputted. The output clock signal CLKout is used as a clock of the launch and capture operations upon the shift operation of the circuit to be tested 62, which becomes an object of the delay test according to the scan path, and the circuit configuration of the part related to generation of the output clock signal CLKout is exactly the same as the fifth embodiment.

The second pulse signal SEout to be outputted from the second pulse generating circuit 63 can be used as a scan enable signal of the circuit to be tested 62 as well as the output clock signal CLKout.

As shown in FIG. 39, regarding the output clock signal CLKout and the second pulse signal SEout, the rising of the output clock signal CLKout (generation of the launch operation pulse P1), the falling of the second pulse signal SEout (switching from the scan mode to the actual operational mode), and the rising of the output clock signal CLKout (generation of the capture operation pulse P2) are generated by turns with reference to the rising edge of the input clock signal CLKin after the falling of the external control signal SE (after the operation is shifted from the shift operation to the launch and capture operations), and a signal called as a last shift mode to be needed upon the delay test can be generated by the pulse generating circuit 70. In addition, by means of the pulse generating circuit 70 according to the sixth embodiment, a pulse generating circuit, which can conduct a delay test according to not only a broad side system but also a skewed load method, can be realized.

Next, other embodiment of the present invention will be described.

(1) In the above-described first and second embodiments, a delay time measuring circuit of the propagation delay time Dre with respect to the rising edge and a propagation delay time Dfe with respect to the falling edge when a phase relationship between the inputs and the outputs of the delay circuits 2 and 12 is the same phase and a measuring method thereof are described. When a phase relationship between the inputs and the outputs of the delay circuits 2 and 12 is the reverse phase, a signal level (a logic level) of an output signal to an input signal is reversed, so that a monostable multivibrator is configured so as to output a rising pulse of a predetermine pulse width in response to a falling edge in the case of measuring the propagation delay time Dre with respect to the rising edge of the input signal, and on the contrary, to output a falling pulse of a predetermine pulse width in response to a rising edge in the case of measuring the propagation delay time Dfe with respect to the falling edge of the input signal. Thereby, the embodiments can be applied to the case that the phase relation between the inputs and the outputs of the delay circuits 2 and 12 is the reverse phase.

(2) In the above-described first and second embodiments, upon obtaining of the propagation delay times Dre and Dfe of the delay circuits 2 and 12, which are circuits to be tested, from a relational expression of the mathematical expression 9 or 10, the case that the delay times Dmrr and Dmff of the monostable multivibrators 3 and 13 are developed in advance and they are known is supposed, however, the delay times Dmrr and Dmff of the monostable multivibrators 3 and 13 may be developed from measurement of the period Tpf of the ring oscillation operation. For example, they may be developed as follows: preparing two kinds of positive feedback loops, one of which comprises one stage of the monostable multivibrator 3 or 13 and the other of which comprises a plurality of stages of the monostable multivibrator 3 or 13; obtaining the periods Tpf of the ring oscillation operations in these two kinds of positive feedback loops, respectively; and dividing the difference between respective periods Tpf by the difference of the number of stages of the monostable multivibrator 3 or 13 between the two kinds of positive feedback loops to obtain the delay times Dmrr and Dmff of the monostable multivibrator 3 or 13 per stage.

(3) In the above-described third embodiment, the case that the testing circuit 20 and the clock generating circuit 30 according to the present invention are formed on the same semiconductor substrate to be incorporated in one LSI chip is supposed, however, some circuits of the testing circuit 20 may be formed by an external circuit or an external measuring apparatus. For example, the number counter 25 or the frequency measuring circuit 27 may be mounted externally.

(4) With respect to the pulse generating circuits 50 and 70 according to the above-described fifth and sixth embodiments, the embodiment having the delay circuit unit formed by cascade-connecting two variable delay circuits 51 and 52 is described, however, the configuration of the delay circuit unit is not limited to the configuration, which is illustrated in the above-described fifth and sixth embodiments.

Figure 40:
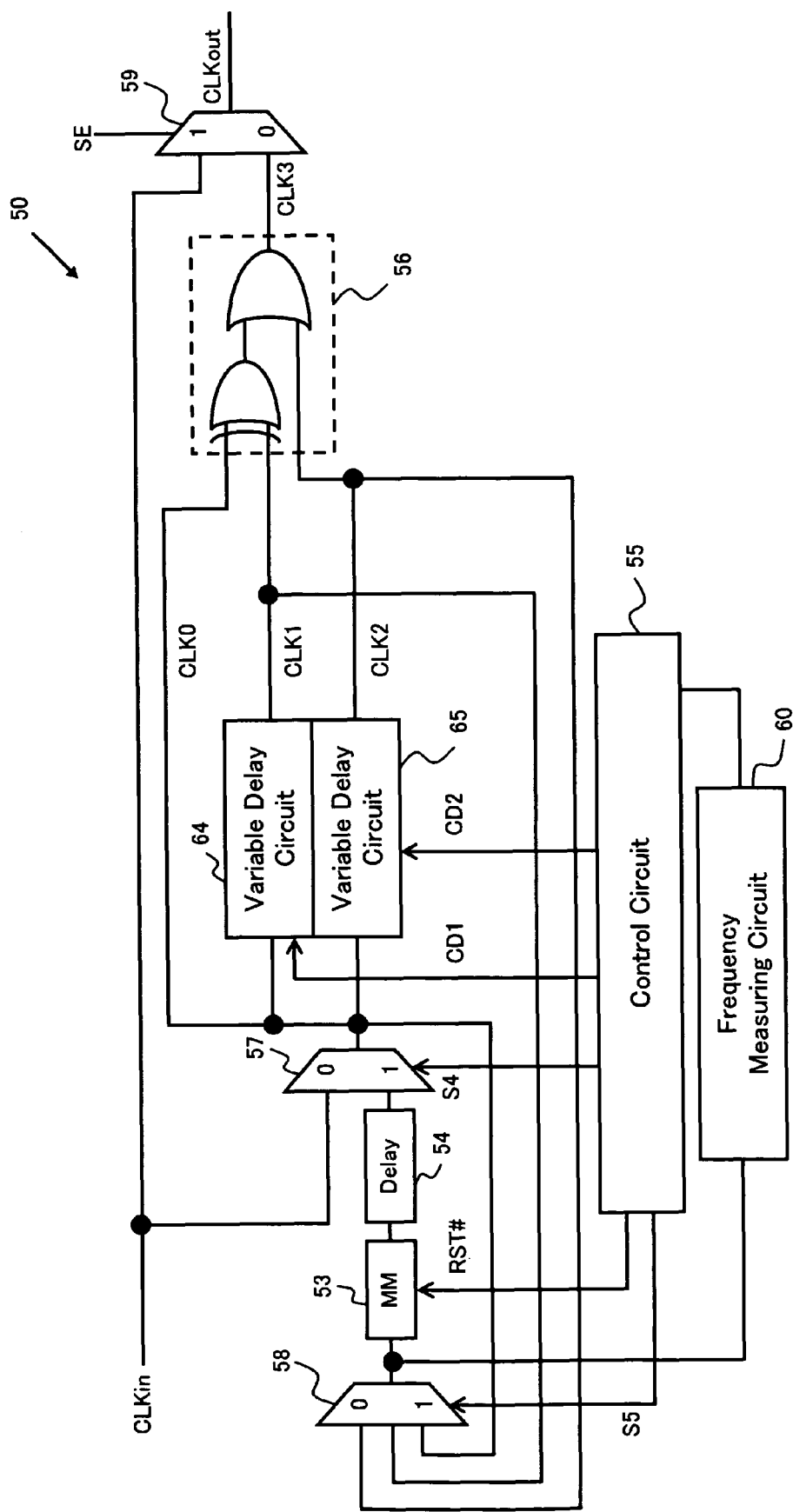
FIG. 40 is a circuit block diagram showing a circuit configuration of other embodiment of a pulse generating circuit according to the present invention, in which a configuration of a delay circuit unit is different.

For example, a configuration of the delay circuit unit as shown in FIG. 40 is preferable, in which two variable delay circuits 64 and 65 are arranged in parallel, the output signal CLK0 of the signal selecting circuit 57 is inputted into the two variable delay circuits 64 and 65, and the first delay signal CLK1 and the second delay signal CLK2 having the different delay times are outputted from the two variable delay circuits 64 and 65, respectively. In this case, one of the variable delay circuits 64 and 65, which has a longer delay time, corresponds to two variable delay circuits 51 and 52, which are cascade-connected, in the above-described fifth and sixth embodiments, and the other of the variable delay circuits 64 and 65, which has a shorter delay time, corresponds to the variable delay circuit 51 at the front stage. Further, the same change is possible also in the sixth embodiment.

Figure 41:
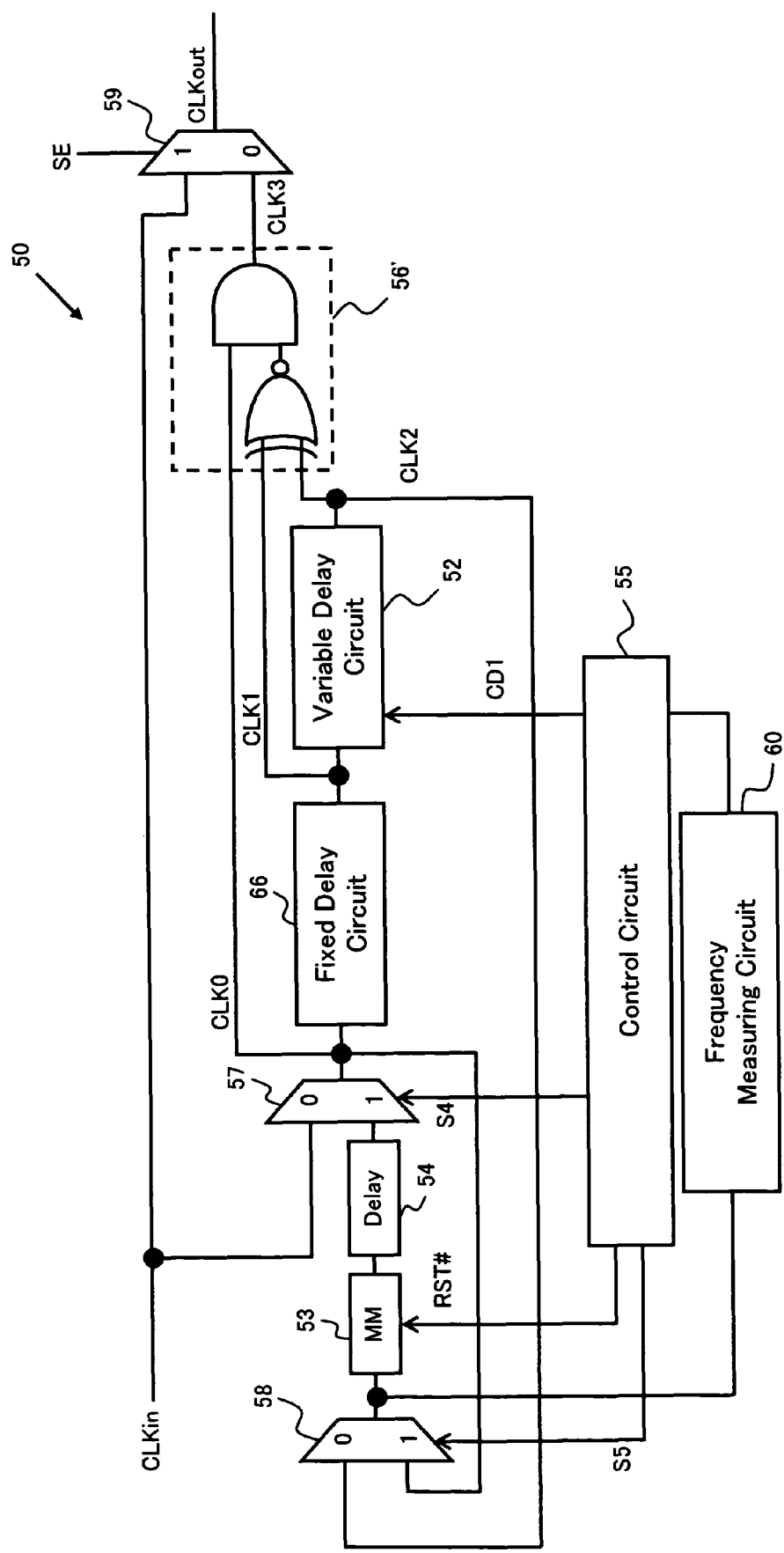
FIG. 41 is a circuit block diagram showing a circuit configuration of further other embodiment of a pulse generating circuit according to the present invention, in which a configuration of a delay circuit unit is different.

Further, as shown in FIG. 41, one of two variable delay circuits 51 and 52 forming the delay circuit unit may be replaced with the fixed delay circuit 66 of a fixed time, of which delay time cannot be adjusted by the control circuit 55. In the sixth embodiment, the same change is possible. Furthermore, also in the configuration of the delay circuit unit shown in FIG. 40, the other of the variable delay circuits 64 and 65, of which delay time is shorter, can be replaced with the fixed delay circuit.

Figure 42:
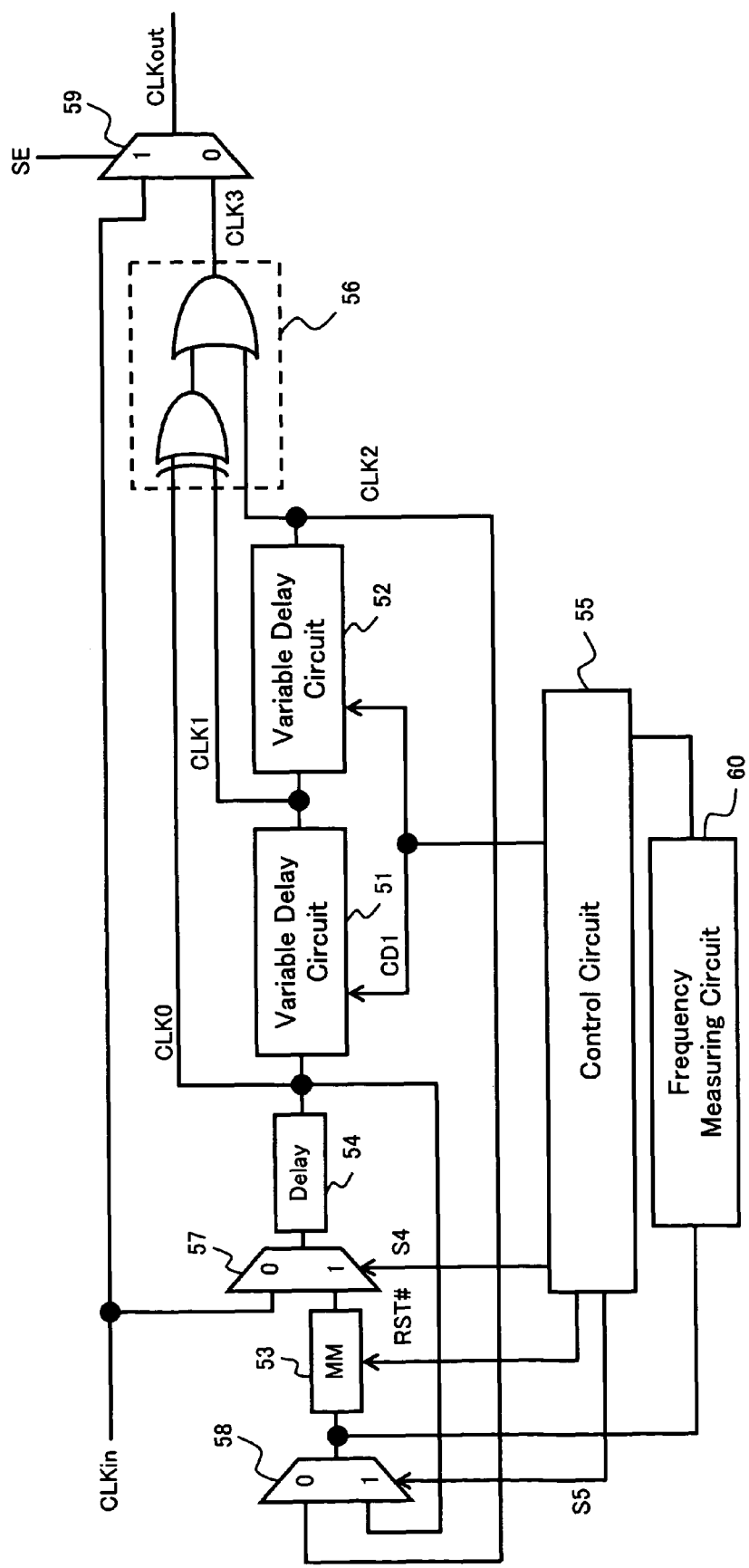
FIG. 42 is a circuit block diagram showing a circuit configuration of still other embodiment of a pulse generating circuit according to the present invention, in which a configuration of a delay circuit unit is different.

In addition, the fixed delay circuit 54, which is mounted on the rear stage of the monostable multivibrator 53 may be moved to the input side of the monostable multivibrator 53, and further, as shown in FIG. 42, this fixed delay circuit 54 may be moved between the signal selecting circuit 57 and the delay circuit unit.

(5) In the sixth embodiment, as shown in FIG. 37, the pulse generating circuit 56' illustrated in FIG. 30 of the fifth embodiment is used, however, the pulse generating circuit 56 illustrated in FIG. 27 of the fifth embodiment may be used. In addition, the circuit configuration of the pulse generating circuit is not limited to the circuit configurations illustrated in FIG. 27 and FIG. 30, and any circuit configuration is available if this pulse generating circuit generates a pulse signal CLK3 having at least two times of the rising edges or the falling edge within one period of the input clock signal CLKin from the input clock signal CLKin, the first delay signal CLK1, and the second delay signal CLK2, and having the time difference Δt between two times of the rising edges or the falling edges being equal to the delay time of the second delay signal CLK2 from the input clock signal CLKin.

INDUSTRIAL APPLICABILITY

The ring oscillation circuit, the delay time measuring circuit and a delay time measuring method, and a testing circuit and a testing method according to the present invention can be used in order to evaluate a timing accuracy of a clock signal, which is generated by a PLL circuit or the like, with a high accuracy. Further, the pulse generating circuit, and a testing method of the semiconductor integrated circuit according to the present invention can be used for the delay test according to the scan path method of the semiconductor integrated circuit, and the semiconductor integrated circuit according to the present invention can be used for the semiconductor integrated circuit, which is configured so as to be capable of conducting the delay test according to the scan path method.

The invention claimed is:

1. A ring oscillation circuit comprising:
   a delay circuit; and
   a monostable multivibrator, wherein
   an output of the delay circuit is connected to an input of the monostable multivibrator,
   an output of the monostable multivibrator is connected to an input of the delay circuit,
   the delay circuit and the monostable multivibrator configure a positive feedback loop,
   a pulse width of a pulse signal to be outputted by the monostable multivibrator is shorter than one period of a ring oscillation operation in the positive feedback loop, and
   in the case that the pulse width of the pulse signal to be outputted by the monostable multivibrator is decreased due to a propagation time difference between a rising edge propagation time and a falling edge propagation time of the delay circuit, the pulse width is longer than the propagation time difference.

2. The ring oscillation circuit according to claim 1 comprising:
   an oscillation starting circuit for starting oscillation upon receipt of an input of a trigger signal for triggering oscillation on the positive feedback loop.

3. The ring oscillation circuit of claim 1, wherein the output of the delay circuit is directly connected to the input of the monostable multivibrator.

4. A testing circuit for evaluating a liming accuracy of a clock signal of a testing object, the testing circuit comprising:
   a variable delay circuit, capable of controlling a delay time;
   a phase comparing circuit for comparing a phase of the clock signal of the testing object with a phase of a delay clock signal obtained by delaying the clock signal using the variable delay circuit;
   a number counter for counting a number of outputs with respect to a predetermined comparison result from the phase comparing circuit;
   a monostable multivibrator;
   a signal switching circuit for switching a signal to be inputted into the variable delay circuit from the clock signal to a delay signal to be positively returned via the variable delay circuit and the monostable multivibrator to form a ring oscillator due to a positive feedback; and
   a frequency measuring circuit for measuring an oscillation frequency when the ring oscillator is formed by the signal switching circuit.

5. The testing circuit according to claim 4, wherein
   the testing circuit and a clock generating circuit for generating the clock signal of the testing object are formed on a common substrate.

6. A clock generating circuit for generating a clock signal by using a PLL circuit, the clock generating circuit comprising at least:
   the variable delay circuit;
   the monostable multivibrator; and
   the signal switching circuit,
   of the testing circuit according to claim 4 having the clock signal as the testing object.

7. An image sensor comprising:
a light sensor;
memory means for memorizing an output data of the light sensor;
transmitting means for transmitting the output data to be memorized by the memory means; and
a clock generating circuit for generating a clock signal to control each operation of the light sensor, the memory means, and the transmitting means; wherein
the clock generating circuit for generating a clock signal to control at least the operation of the transmitting means is the clock generating circuit according to claim 6.

8. The testing circuit according to claim 4, wherein
a pulse width of a pulse signal to be outputted by the monostable multivibrator is shorter than one period of a ring oscillation operation in the positive feedback loop, and
in the case that the pulse width of the pulse signal to be outputted by the monostable multivibrator is decreased due to a propagation time difference between a rising edge propagation time and a falling edge propagation time of the variable delay circuit, the pulse width is longer than the propagation time difference.

9. A clock generating circuit for generating a clock signal by using a PLL circuit, the clock generating circuit comprising at least:
the variable delay circuit;
the monostable multivibrator; and
the signal switching circuit,
of the testing circuit according to claim 8 having the clock signal as the testing object.

10. The testing circuit according to claim 4, wherein
a pulse width of a pulse signal to be outputted by the monostable multivibrator is shorter than one period of a ring oscillation operation in the positive feedback loop, and
in the case that the pulse width of the pulse signal to be outputted by the monostable multivibrator is increased due to a propagation time difference between a rising edge propagation time and a falling edge propagation time of the variable delay circuit, a sum of the pulse width and the propagation time difference is shorter than one period of the ring oscillation operation in the positive feedback loop.

11. A clock generating circuit for generating a clock signal by using a PLL circuit, the clock generating circuit comprising at least:
the variable delay circuit;
the monostable multivibrator; and
the signal switching circuit,
of the testing circuit according to claim 10 having the clock signal as the testing object.

12. A ring oscillation circuit comprising:
a delay circuit; and
a monostable multivibrator, wherein
an output of the delay circuit is connected to an input of the monostable multivibrator,
an output of the monostable multivibrator is connected to an input of the delay circuit,
the delay circuit and the monostable multivibrator configure a positive feedback loop,
a pulse width of a pulse signal to be outputted by the monostable multivibrator is shorter than one period of a ring oscillation operation in the positive feedback loop, and
in the case that the pulse width of the pulse signal to be outputted by the monostable multivibrator is increased due to a propagation time difference between a rising edge propagation time and a falling edge propagation time of the delay circuit, a sum of the pulse width and the propagation time difference is shorter than one period of the ring oscillation operation in the positive feedback loop.

13. The ring oscillation circuit according to claim 12, comprising:
an oscillation starting circuit for starting oscillation upon receipt of an input of a trigger signal for triggering oscillation on the positive feedback loop.

14. The ring oscillation circuit according to claim 12, wherein the output of the delay circuit is directly connected to the input of the monostable multivibrator.

* * * * *